US006453452B1

United States Patent
Chang et al.

(10) Patent No.: US 6,453,452 B1
(45) Date of Patent: Sep. 17, 2002

(54) METHOD AND APPARATUS FOR DATA HIERARCHY MAINTENANCE IN A SYSTEM FOR MASK DESCRIPTION

(75) Inventors: Fang-Cheng Chang, Mountain View; Yao-Ting Wang, Sunnyvale; Yagyensh C. Pati, Redwood City, all of CA (US)

(73) Assignee: Numerical Technologies, Inc., San Jose, CA (US)

( * ) Notice: Subject to any disclaimer, the term of this patent is extended or adjusted under 35 U.S.C. 154(b) by 0 days.

(21) Appl. No.: 09/154,397

(22) Filed: Sep. 16, 1998

Related U.S. Application Data

(60) Provisional application No. 60/069,549, filed on Dec. 12, 1997.

(51) Int. Cl.[7] ............................ G06F 17/50; G06F 9/45
(52) U.S. Cl. .............................................. 716/8; 716/19
(58) Field of Search ................................ 716/19; 718/8

(56) References Cited

U.S. PATENT DOCUMENTS

| | | | |
|---|---|---|---|
| 4,812,962 A | 3/1989 | Witt ............................ | 364/490 |
| 5,051,598 A | 9/1991 | Ashton et al. ............ | 250/492.2 |
| 5,182,718 A | 1/1993 | Harafuji et al. ............. | 364/490 |
| 5,241,185 A | 8/1993 | Meiri et al. ............... | 250/492.2 |
| 5,242,770 A | 9/1993 | Chen et al. ..................... | 430/5 |
| 5,256,505 A | 10/1993 | Chen et al. ..................... | 430/5 |
| 5,316,878 A | 5/1994 | Saito et al. ..................... | 430/5 |
| 5,326,659 A | 7/1994 | Liu et al. ........................ | 430/5 |

(List continued on next page.)

FOREIGN PATENT DOCUMENTS

| | | | |
|---|---|---|---|
| EP | 0 698 821 | | 2/1996 |
| GB | 2324169 | * | 10/1998 |
| JP | 0308525 A | * | 4/1991 |
| WO | WO-14636 A1 | * | 3/1999 |
| WO | WO 00/36525 A3 | | 6/2000 |
| WO | WO 00/67074 A1 | | 11/2000 |
| WO | WO 00/67075 A1 | | 11/2000 |
| WO | WO 00/67076 A1 | | 11/2000 |

OTHER PUBLICATIONS

Harafuji, K. et al., A Novel Hierarchical Approach for Proximity Effect Correction in Electron Beam Lithography, IEEE Transactions on COmputer–Aided Design of Integrated Circuits and Systems, Col. 12, Issue 10, pp. 1508–1514, Oct. 1993.*

(List continued on next page.)

*Primary Examiner*—Matthew Smith
*Assistant Examiner*—A. M. Thompson
(74) *Attorney, Agent, or Firm*—Mark A. Haynes; Haynes Beffel & Wolfeld LLP

(57) ABSTRACT

A method and apparatus for performing an operation on hierarchically described integrated circuit layouts such that the original hierarchy of the layout is maintained is provided. The method comprises providing a hierarchically described layout as a first input and providing a particular set of operating criteria corresponding to the operation to be performed as a second input. The mask operation, which may include operations such as OPC and logical operations such as NOT and OR, is then performed on the layout in accordance with the particular set of operating criteria. A first program data comprising hierarchically configured correction data corresponding to the hierarchically described layout is then generated in response to the layout operation such that if the first program data were applied to the flattened layout an output comprising data representative of the result of performing the operation on the layout would be generated. As the first program data is maintained in a true hierarchical format, layouts which are operated upon in accordance with this method are able to be processed through conventional design rule checkers. Further, this method is capable of being applied to all types of layouts including light and dark field designs and phase shifting layouts.

92 Claims, 19 Drawing Sheets

U.S. PATENT DOCUMENTS

| | | | |
|---|---|---|---|
| 5,340,700 A | 8/1994 | Chen et al. | 430/312 |
| 5,424,154 A | 6/1995 | Borodovsky | 430/5 |
| 5,432,714 A | 7/1995 | Chung et al. | 364/525 |
| 5,447,810 A | 9/1995 | Chen et al. | 430/5 |
| 5,532,090 A | 7/1996 | Borodovsky | 430/5 |
| 5,533,148 A | 7/1996 | Sayah et al. | 382/240 |
| 5,538,815 A | 7/1996 | Oi et al. | 430/5 |
| 5,553,273 A | 9/1996 | Liebmann | 395/500 |
| 5,572,598 A | 11/1996 | Wihl et al. | 382/144 |
| 5,631,110 A | 5/1997 | Shioiri et al. | 430/5 |
| 5,657,235 A | 8/1997 | Liebmann et al. | 364/474.24 |
| 5,663,893 A | 9/1997 | Wampler et al. | 364/491 |
| 5,682,323 A * | 10/1997 | Pasch et al. | 364/491 |
| 5,702,848 A | 12/1997 | Spence | 430/5 |
| 5,705,301 A | 1/1998 | Garza et al. | 430/5 |
| 5,707,765 A | 1/1998 | Chen | 430/5 |
| 5,740,068 A | 4/1998 | Liebmann et al. | 364/489 |
| 5,795,688 A | 8/1998 | Burdorf et al. | 430/30 |
| 5,801,954 A | 9/1998 | Le et al. | 364/488 |
| 5,804,340 A | 9/1998 | Garza et al. | 430/5 |
| 5,815,685 A | 9/1998 | Kamon | 395/500 |
| 5,825,647 A | 10/1998 | Tsudaka | 364/167.03 |
| 5,827,623 A | 10/1998 | Ishida et al. | 430/5 |
| 5,847,959 A | 12/1998 | Veneklasen et al. | 364/468.28 |
| 5,849,440 A | 12/1998 | Lucas et al. | 430/5 |
| 5,858,580 A * | 1/1999 | Wang et al. | 430/5 |
| 5,863,682 A | 1/1999 | Abe et al. | 430/30 |
| 5,879,844 A * | 3/1999 | Yamamoto et al. | 430/30 |
| 5,885,734 A * | 3/1999 | Pierrat et al. | 430/5 |
| 5,923,566 A * | 7/1999 | Galan et al. | 364/489 |
| 6,009,250 A | 12/1999 | Ho et al. | 395/500.06 |
| 6,009,251 A | 12/1999 | Ho et al. | 395/500.06 |
| 6,011,911 A | 1/2000 | Ho et al. | 395/500.06 |
| 6,077,310 A | 6/2000 | Yamamoto et al. | 716/19 |
| 6,081,658 A | 6/2000 | Rieger et al. | 395/500.22 |

OTHER PUBLICATIONS

M. Rieger, et al. "System for Lithography Proximity Compensation", Sep. 10, 1993.

J. Stirniman, et al. "Wafer Proximity Correction and its Impact on Mask–Making", Bacus News Photomask, vol. 10, Issue 1, Jan. 1994, pp. 1–12.

M. Rieger, et al. "Using Behavior Modelling for Proximity Correction", 1994.

J. Stirniman, et al. "Fast Proximity Correction With Zone Sampling", SPIE 2197 1994, pp. 294–301.

J. Stirniman, et al. "Optimizing Proximity Correction for Wafer Fabrication Processes", SPIE 2322 1994 pp. 239–246.

OPC Technology & Product Description "Microunity" MicroUnity Systems Engineering, Inc. Copyright 1996.

M. Rieger, et al. "Customizing Proximity Correction for Process–Specific Objectives" SPIE vol. 2726, 1996, pp. 1–9.

A. Yen, et al. "Characterization and Correction of Optical Proximity Effects in Deep–Ultraviolet Lithography Using Behavior Modeling", J. Vac. Sci Technol. B 14(6) Nov./Dec. 1996, American Vacuum Society, pp. 4175–4178.

Precim, "Proxima Wafer Proximity Correction System", pp. 1–2.

Signamask Data Sheet, "Lithas: Optical Proximity Correction Software", pp. 1–2.

Trans Vector Technologies Inc., "Now Better Quality Photomasks", pp. 1–4.

M. Rieger, et al. "Mask Fabrication Rules for Proximity-–Corrected Patterns", pp. 1–10.

Precim Company, "Proxima System", pp. 1–2.

J. Stirniman, et al. "Spatial Filter Models to Describe IC Lithographic Behavior" pp. 1–10.

M. Sugawara, et al. "Defect Printability Study of Attenuated Phase–Shifting Masks for Specifying Inspection Sensitivity", pp. 1–16.

Barouch, et al., "OPTIMASK: An OPC Algorithm for Chrome and Phase–Shift Mask Design", SPIE—The International Society for Optical Engineering, vol. 2440, pp. 191–206, Feb. 22–24, 1995.

Nistler, et al., "Large Area Optical Design Rule Checker For Logic PSM Application", SPIE—The International Society for Optical Engineering, vol. 2254, pp. 78–92, (1994).

Spence, et al., "Detection of 60° Phase Defects on Alternating PSMs", SPIE—The International Society for Optical Engineering, vol. 3412, pp. 480–495, (1998).

Spence, et al., "Automated Determination of CAD Layout Failures Through Focus: Experiment and Simulation", SPIE—The International Society for Optical Engineering, vol. 2197, pp. 302–313, (1994).

Sugawara, et al., "Defect Printability Study of Attenuated Phase–Shifting Masks for Specifying Inspection Sensitivity", SPIE—The International Society for Optical Engineering, vol. 2621, pp. 457–472, (1995).

Chang, K. et al., "Accurate Modeling of Deep submicron Interconnect Technology", TMA Times, vol. IX, No. 3 (1997).

Brunner, T. et al., "Approximate models for resist processing effects", SPIE, vol. 2726, p. 198 (1996).

Henke, W. et al., "A study of reticle defects imaged into three–dimensional developed profiles of positive photoresist using the SOLID lithography simulator", Microelectronic Eng., vol. 14, pp. 283–297 (1991).

Karklin, L., "A comprehensive simulation study of the photomask defects printability", SPIE, vol. 2621, pp. 490–504 (1995).

Ham, Y.M. et al., "Dependence of Defects in Optical Lithography", Jpn. J. Appl. Phys., vol. 31, pp. 4137–4142, Dec. 1992.

Wiley, J. et al., "The Effect of Off–Axis Illumination of the Printability of Opaque and Transparent Reticle Defects", SPIE, vol. 2512, pp. 432–440 (1995).

Nistler, J. et al., "Phase Shift Mask Defect Printability Analysis", proceedings of the '93 Conference on Microlithography, OCG Microelectronic Materials, Inc., (1993) pp. 11–28.

Ohtsuka, H. et al., "Phase Defect Repair Method for Alternating Phase Shift Masks Conjugate Twin–Shifter Method", Jpn. J. Appl. Phys., vol. 31, pp. 4143–4149, Dec. 1992.

Watanabe, H. et al., "Detection and Printability of Shifter Defects in Phase–Shifting Masks II. Defocus Characteristics", Jpn. J. Appl. Phys., vol. 31, pp. 4155–4160, Dec. 1992.

Wiley, J. et al., "Phase Shift Mask Pattern Accuracy Requirements and Inspection Technology", SPIE, vol. 1464, pp. 346–355 (1991).

Wiley, J. et al., "Device Yield and Reliability by Specification of Mask Defects", Solid State Technology, vol. 36, No. 7, pp. 65–66, 70, 72, 74, 77, Jul. 1993.

Pati, Y.C. et al., "Exploiting Structure in Fast Aerial Image Computation for Integrated Circuit Patterns", IEEE Transactions on Semiconductor Manufacturing, vol. 10, No. 1, Feb. 1997, pp. 62–74.

Pati, Y.C. et al., "Phase–shifting masks for microlithography: automated design and mask requirements", J. Opt. Soc. Am., vol. 11, No. 9, Sep. 1994, pp. 2438–2452.

Ibsen, K. et al., "Clear Field Reticle Defect Disposition for Advanced Sub–Half Micron Lithography", Proceedings of the 17th Annual Symposium on Photomask Technology and Management, *SPIE*, vol. 3236, pp. 124–135 (1997).

Roman, B. et al., "Implications of Device Processing on Photomask CD Requirements", Proceedings of the 17th Annual Symposium on Photomask Technology and Management, *SPIE*, vol. 3236, (1997) (Abstract only).

Gans, F. et al., "Printability and Repair Techniques for DUV Photomasks", Proceedings of the 17th Annual Symposium on Photomask Technology and Management, *SPIE*, vol. 3236, pp. 136–141 (1997).

Morimoto, H. et al., "Next Generation Mask Strategy—Are technologies ready for mass production of 256 MDRAM?", Proceedings of the 17th Annual Symposium on Photomask Technology and Management, *SPIE*, vol. 3236, pp. 188–189 (1997).

Vacca, A. et al, "100nm defect detection using a dynamically programmable image processing algorithm", Proceedings of the 17th Annual Symposium on Photomask Technology and Management, *SPIE*, vol. 3236, pp. 208–215 (1997).

Ishiwata, N. et al., "Novel alternating phase shift mask with improved phase accuracy", Proceedings of the 17th Annual Symposium on Photomask Technology and Management, *SPIE*, vol. 3236, pp. 243–249 (1997).

Park, C. et al., "An Automatic Gate CD Control for A Full Chip Scale SRAM Device", Proceedings of the 17th Annual Symposium on Photomask Technology and Management, *SPIE*, vol. 3236, pp. 350–357 (1997).

Casey, Jr., D. et al., "Chemically Enhanced FIB Repair of Opaque Defects on Molybdenum Silicide Photomasks", Proceedings of the 17th Annual Symposium on Photomask Technology and Management, *SPIE*, vol. 3236, pp. 487–497 (1997).

H. Jinbo et al., "0.2 um Or Less i–Line Lithography By Phase–Shifting–Mask Technology", *IEEE 1990*, pp. 33.3.1–33.3.4.

H. Jinbo, et al. "Application of Blind Method to Phase–Shifting Lithography", *IEEE 1992*, 1992 Symposium on VLSI Technology Digest of Technical Papers, pp. 112–113.

T. Kimura et al., "Subhalf–Micron Gate Gaas Mesfet Process Using Phase–Shifting–Mask Technology", *IEEE 1991*, GaAs 1C Symposium, pp. 281–284.

H. Jinbo et al., "Improvement of Phase–Shifter Edge Line Mask Method", *Japanese Journal of Applied Physics* vol. 30, No. 11B, Nov. 1991, pp. 2998–3003.

T. Brunner "Rim Phase–Shift Mask Combined with Off–Axis Illumination: A Path 0.5/Numerical Aperture Geometries", *Optical Engineering*, Oct. 1993, vol. 32 No. 10, pp. 2337–2343.

Harafuji, K. et al., "A Novel Hierarchical Approach For Proximity Effect Correction In Electron Beam Lithography", *IEEE*, vol. 12, No. 10, pp. 1508–1514, Oct. 1993.

Neureuther, A., "Modeling Phase Shifting Masks", *SPIE*, 10$^{th}$ Annual Symposium on Microlithography, vol. 1496, pp. 80–85 (1990).

Vacca, A. et al., "100nm Defect Detection Using An Existing Image Acquisition System", *SPIE*, vol. 3236, pp. 208–214 (1998).

* cited by examiner

100 Simple Integrated Circuit Layout

110 Hierarchical Representation of Layout

Typical OPC Corrections

Generating a Delta Plane for OPC

| | |
|---|---|
| 1100 Find the Overlap Areas Within Parent Cell and Flatten these Areas |  |
| 1110 Generate Intermediate Correction Plane for Flattened Overlap Areas |  |
| 1120 Sum the Correction Planes of all the Children Cells of the Parent Cell |  |
| 1130 Generate the Delta Plane and Store Data in Hierarchy |  |

METHOD AND APPARATUS FOR DATA HIERARCHY MAINTENANCE IN A SYSTEM FOR MASK DESCRIPTION

RELATED APPLICATIONS

This application relates to, claims benefit of the filing date of, and incorporates by reference, the United States provisional patent application entitled "Data Hierarchy Advanced Mask Correction and Verification Method and Apparatus," having serial No. 60/069,549, filed on Dec. 12, 1997, and invented by Fang-Cheng Chang, Yao-Ting Wang and Yagyensh C. Pati. Further, this application relates to and incorporates by reference, the U.S. provisional patent application entitled, "Mask Verification, Correction, and Design Rule Checking" having serial No. 60/059,306, filed Sep. 17, 1997, and invented by Fang-Cheng Chang, Yao-Ting Wang and Yagyensh C. Pati and U.S. patent application entitled, "Mask Verification, Correction, and Design Rule Checking", filed Sep. 16, 1998, and invented by Fang-Cheng Chang, Yao-Ting Wang and Yagyensh C. Pati. This application also relates to and incorporates by reference the U.S. patent application entitled "Visual Inspection and Verification System", filed Aug. 7, 1998, and invented by Fang-Cheng Chang, Yao-Ting Wang, Yagyensh C. Pati, and Linard Karklin. This application also relates to and incorporates by reference, the U.S. patent application entitled, "Phase Shifting Circuit Manufacture Method and Apparatus" having Ser. No. 08/931,921; filed Sep. 17, 1997, and invented by Yao-Ting Wang and Yagyensh C. Pati. Each of the aforementioned patents are assigned to the assignee of the present invention.

THE BACKGROUND OF THE INVENTION a. The Field of the Invention

This invention relates to the field of integrated circuit manufacturing. In particular, the invention relates to concepts and implementation techniques for the quick and efficient design, correction and verification of masks utilized in the manufacture of integrated circuits.

b. Description of Related Art

In designing an integrated circuit (IC), engineers typically rely upon computer simulation tools to help create a circuit schematic design consisting of individual devices coupled together to perform a certain function. To actually fabricate this circuit in a semiconductor substrate the circuit must be translated into a physical representation, or layout, which itself can then be transferred onto the silicon surface. Again, computer aided design (CAD) tools assist layout designers in the task of translating the discrete circuit elements into shapes which will embody the devices themselves in the completed IC. These shapes make up the individual components of the circuit, such as gate electrodes, field oxidation regions, diffusion regions, metal interconnections, and so on.

The software programs employed by these CAD systems are usually structured to function under a set of predetermined design rules in order to produce a functional circuit. Often, these rules are determined by certain processing and design limitations. For example, design rules may define the space tolerance between devices or interconnect lines so as to ensure that the devices or lines do not interact with one another in any unwanted manner. Design rule limitations are frequently referred to as critical dimensions. A critical dimension of a circuit is commonly defined as the smallest width of a line or the smallest space between two lines. Consequently, the critical dimension determines the overall size and density of the IC. In present IC technology, the smallest critical dimension for state-of-the-art circuits is approximately 0.25 microns for line widths and spacings.

Once the layout of the circuit has been created, the next step to manufacturing the integrated circuit (IC) is to transfer the layout onto a semiconductor substrate. Optical lithography is a well known process for transferring geometric shapes onto the surface of a silicon wafer. The optical lithography process generally begins with the formation of a photoresist layer on the top surface of a semiconductor wafer. A mask having fully light non-transmissive opaque regions, which are usually formed of chrome, and fully light transmissive clear regions, which are usually formed of quartz, is then positioned over the photoresist coated wafer. Light is then shone on the mask via a visible light source or an ultra-violet light source. The light is focused to generate a reduced mask image on the wafer typically using an optical lens system which contains one or several lenses, filters, and or mirrors. This light passes through the clear regions of the mask to expose the underlying photoresist layer, and is blocked by the opaque regions of the mask, leaving that underlying portion of the photoresist layer unexposed. The exposed photoresist layer is then developed, typically through chemical removal of the exposed/non-exposed regions of the photoresist layer. The end result is a semiconductor wafer coated with a photoresist layer exhibiting a desired pattern which defines the geometries, features, lines and shapes of that layer. This pattern can then be used for etching underlying regions of the wafer.

Besides the aforementioned design rules, the resolution value of the exposure tool used in optical lithography also places limits on the designers of integrated circuit layouts. The resolution for an exposure tool is defined as the minimum feature that the exposure tool can repeatedly expose onto the wafer. Currently, the resolution for most advanced optical exposure tools is around 0.25 micron. As the critical dimensions of the layout become smaller and approach the resolution value of the lithography equipment, the consistency between the mask and the actual layout pattern developed in the photoresist is significantly reduced. Specifically, it is observed that differences in pattern development of circuit features depends upon the proximity of the features to one another.

With these limitations on IC design in mind, we note the data describing an IC pattern is usually represented in a condensed hierarchical fashion such as in a GDS-II data file. At the higher levels of pattern representation hierarchy, features are represented in a conceptual manner. For instance, a memory array may be described as having a given cell repeated for a certain number of rows and columns. The next lower level in the hierarchy might describe the basic memory cell, comprised of subcells A and B. Finally, at the lowest level, the most primitive subcells contain geometric primitives-rectangles and polygons. In order to generate a physical mask, the hierarchical data must first be flattened, enumerating every geometric instance described in the hierarchy. Flattening of the hierarchy typically results in several orders of magnitude increase in the size of data storage required to represent the pattern.

Since flattening the hierarchy results in such a large increase in the size of the file representing a given IC design, it is desirable to flatten the hierarchy at the latest point in the manufacture of a mask, which, in the best case, is at the time the mask design is loaded into the EB machine prior to physical manufacture. Currently however, this flattening process takes place at an earlier stage in the production of masks for some complicated IC's. This is because the original mask design for a complicated IC is typically manipulated after the original design is completed in order to perform one of a number of operations on the design. These operations are performed because of the precision needed in the masks for complicated IC's as the critical dimensions of these IC's approach the resolution limits of optical lithography. Currently, these operations require some sort of flattening of the original design data in order to be performed—resulting in an earlier than desired flattening of the design data.

These operations include the performance of logical operations, the generation of optical proximity corrections, the generation of phase shifting masks, and the design rule checking of masks that have undergone these operations. For instance, since the physical mask making process may introduce known distortions in the mask that are dependent upon the particular EB machine being used, mask makers may use logical operations such as AND or NOT operations between design layers to generate new mask layers which compensate for these known distortions. Further, mask designers may generate sub-resolution optical proximity correction features for a mask to compensate for the proximity effects which occur when very closely spaced pattern features are lithographically transferred to a resist layer on a wafer. Similarly, mask designers may generate phase shifting masks to overcome the effect of resolution limits on achievable circuit critical dimensions. Currently, each of these operations requires a flattening of the original design data in order to be performed. Further, and more importantly, because they do not maintain the original true hierarchical data format of the mask design, it is extremely difficult and time consuming to verify currently known masks upon which one of the previously mentioned operations has been performed using conventional verification tools which require the same hierarchical data format as the original mask.

Therefore, what is desired is a method and apparatus for performing operations on integrated circuit mask designs that solve the aforementioned problems of currently existing systems.

A SUMMARY OF THE INVENTION

As discussed above, currently known systems for performing operations on integrated circuit design layouts are not capable of preserving the original hierarchy of the design. This leads to several problems including a large increase in data, a reduction in processing speed, and the loss of the ability to quickly check processed designs for correctness using conventional verification tools.

Accordingly, the present invention solves the aforementioned problems by providing a method and apparatus for performing an operation in accordance with a particular set of operating criteria on a hierarchically described integrated circuit layout such that the original hierarchy of the layout is maintained.

Thus in one embodiment of the present invention, in a system for performing an operation on a hierarchically described photolithography mask containing a plurality of cells, a computer program product is provided which includes a first program data. The first program data includes hierarchically configured correction data corresponding to the hierarchically described layout such that if the first program data were applied to the flattened layout an output comprising data representative of the result of performing the operation on the layout would be generated.

In one embodiment, the first program data is further characterized in that it comprises a plurality of delta planes that correspond to the plurality of cells. In this instance, the delta plane of a particular cell comprises data representative of the difference between a correction plane of the particular cell and the delta planes corresponding to the children cells of the particular cell. Further, the correction plane for each cell of the plurality of cells comprises data that would generate an output representative of the result of performing the operation on the cell if the correction plane were applied to the flattened cell data.

In one embodiment, the delta plane for each cell in the hierarchically described integrated circuit layout accounts for interaction between each of the cell's child cells and interaction between the cell's primitive geometry and each of the cell's child cells.

In a further characterization of the above embodiment the first program data may comprise a set of arithmetically or logically described delta planes. Still further, the first program data may be described by a GDS-II data file.

The present invention as summarized above with respect to a first program data may be alternatively characterized as a method of performing an operation on a hierarchically described integrated circuit layout. The method includes, in one embodiment, providing a hierarchically described layout as a first input wherein the layout comprises a plurality of cells, and providing a particular set of operating criteria as a second input. The method also includes performing a layout operation in accordance with the particular set of operating criteria on the layout and generating a first program data comprising hierarchically configured correction data corresponding to the hierarchically described layout. The first program data is generated in response to the layout operation such that if the first program data were applied to the flattened layout an output comprising data representative of the result of performing the operation on the layout would be generated.

In another embodiment of the method, the first program data comprises a plurality of delta planes that correspond to the plurality of cells. In this embodiment, the delta plane of a particular cell comprises data representative of the difference between a correction plane of the particular cell and the delta planes corresponding to the children cells of the particular cell. Further, the correction plane for each cell of the plurality of cells comprises data that would generate an output representative of the result of performing the operation on the cell if the correction plane were applied to the flattened cell data. Still further, in one embodiment, the delta plane for each cell in the hierarchically described integrated circuit layout accounts for interaction between each of the cell's child cells and interaction between the cell's primitive geometry and each of the cell's child cells.

In another embodiment wherein the first program data is characterized as comprising a plurality of delta planes corresponding to the plurality of cells, the step of generating the first program data further comprises compiling and linking the hierarchically described layout. In this instance, compiling comprises generating a first correction layer for each cell in response to the particular set of operating criteria. Linking comprises modifying the correction layer of each cell in response to the particular set of operating criteria to generate the delta plane for each cell. In this instance, the delta plane of each cell accounts for interaction between each of the cell's child cells and interaction between the cell's primitive geometry and each of the cell's child cells.

In a further characterization of this embodiment, for each cell in the layout the sum of the cell's delta plane and the delta planes of the cell's child cells comprises a correction plane of the cell. The correction plane for each cell in the plurality of cells comprises data that would generate an output data representative of the result of performing the operation on the cell if the correction plane were applied to the flattened cell data. In a further instance of the above embodiment, compiling and linking each comprise a depth-wise traversing of the integrated circuit layout.

In another embodiment of the method, linking and compiling may further comprise determining whether each cell has been previously defined and generating a first correction layer and delta plane comprising data indicative of a location of a first instance of a cell definition for each cell which has been previously defined.

A still further embodiment of the method includes combining the first program data with the data describing the integrated circuit layout to produce a second program data that describes a first corrected layout. The second program data is then provided to a design rule checker apparatus, and the design rule checker apparatus is operated to determine whether the first corrected layout falls within a set of integrated circuit design rules.

Another embodiment of the invention is characterized as a photolithography mask produced in accordance with the method steps summarized above.

Lastly, the method steps of the above embodiments may in one instance be performed by a computer running a program of instructions which implements these steps wherein the program is stored on any appropriate computer storage media such as a hard disk or server.

The present invention as summarized above with respect to a first program data and a method may also be alternatively characterized as an apparatus for performing an operation on a hierarchically described integrated circuit layout. The apparatus includes, in one embodiment, a resource for receiving hierarchically described layout as a first input wherein the layout comprises a plurality of cells, and a resource for receiving a particular set of operating criteria as a second input. The apparatus also includes an operation engine which performs a layout operation in accordance with the particular set of operating criteria on the hierarchically described layout, and a hierarchy preserver which generates a first program data comprising hierarchically configured correction data corresponding to the hierarchically described layout. The first program data is generated in response to the layout operation such that if the first program data were applied to the flattened layout an output comprising data representative of the result of performing the mask operation on the layout would be generated.

In another embodiment of the apparatus, the first program data comprises a plurality of delta planes that correspond to the plurality of cells. In this embodiment, the delta plane of a particular cell comprises data representative of the difference between a correction plane of the particular cell and the delta planes corresponding to the children cells of the particular cell. Further, the correction plane for each cell of the plurality of cells comprises data that would generate an output representative of the result of performing the operation on the cell if the correction plane were applied to the flattened cell data. Still further, in one embodiment, the delta plane for each cell in the hierarchically described integrated circuit layout accounts for interaction between each of the cell's child cells and interaction between the cell's primitive geometry and each of the cell's child cells.

In another instance, the apparatus may also include a compiler and a linker. The compiler generates a first correction layer for each cell in response to the particular set of operating criteria. The linker modifies the correction layer of each cell in response to the particular set of operating criteria to generate the delta plane for each cell. In this instance, the delta plane of each cell accounts for interaction between each of the cell's child cells and interaction between the cell's primitive geometry and each of the cell's child cells.

In a further characterization of this embodiment, for each cell in the layout the sum of the cell's delta plane and the delta planes of the cell's child cells comprises a correction plane of the cell. The correction plane for each cell in the plurality of cells comprises data that would generate an output data representative of the result of performing the operation on the cell if the correction plane were applied to the flattened cell data. In a further instance of the above embodiment, the compiler and the linker each perform a depth-wise traversing of the integrated circuit layout to generate the correction planes and delta planes respectively.

A still further embodiment of the apparatus includes a resource for combining the first program data with the data describing the integrated circuit layout to produce a second program data that describes a first corrected layout. A design rule checker is provided to give an indication as to whether the first corrected layout falls within a set of integrated circuit design rules.

In another embodiment of the apparatus, the compiler and the linker may operate to determine whether each cell has been previously defined and to generate a first correction layer and delta plane comprising data indicative of a location of a first instance of a cell definition for each cell which has been previously defined.

Lastly, the apparatus of the above embodiments may in one instance be characterized as a computer program product comprising a computer readable medium having a computer readable program code embodied therein for causing a computer to perform an operation on a hierarchically described integrated circuit layout such that the original hierarchy of the layout is maintained.

Each of the aforementioned embodiments of the present invention can be further characterized further by the following additional descriptions. For instance, the delta planes of the first program data may include either arithmetically or logically described data. Still further, the operation performed on the layout may include any logical or arithmetic operation including for instance, OPC corrections and logical operations such as AND, NOT, OR, NOR and NAND.

Similarly, the first program data may be in any hierarchical data format such as GDS-II, and the computer readable media may include any suitable media for the storage of either data files or program files such as a hard disk drive or a server. Lastly, each of the above embodiments of the present invention may be applied to any layout including bright-field, dark-field, and phase shifting layouts.

Other aspects and advantages of the present invention can be seen upon review of the figures, the detailed description and the claims which follow.

A BRIEF DESCRIPTION OF THE DRAWINGS

The figures illustrate the invention by way of example, and not limitation. Like references indicate similar elements.

Figure 1:
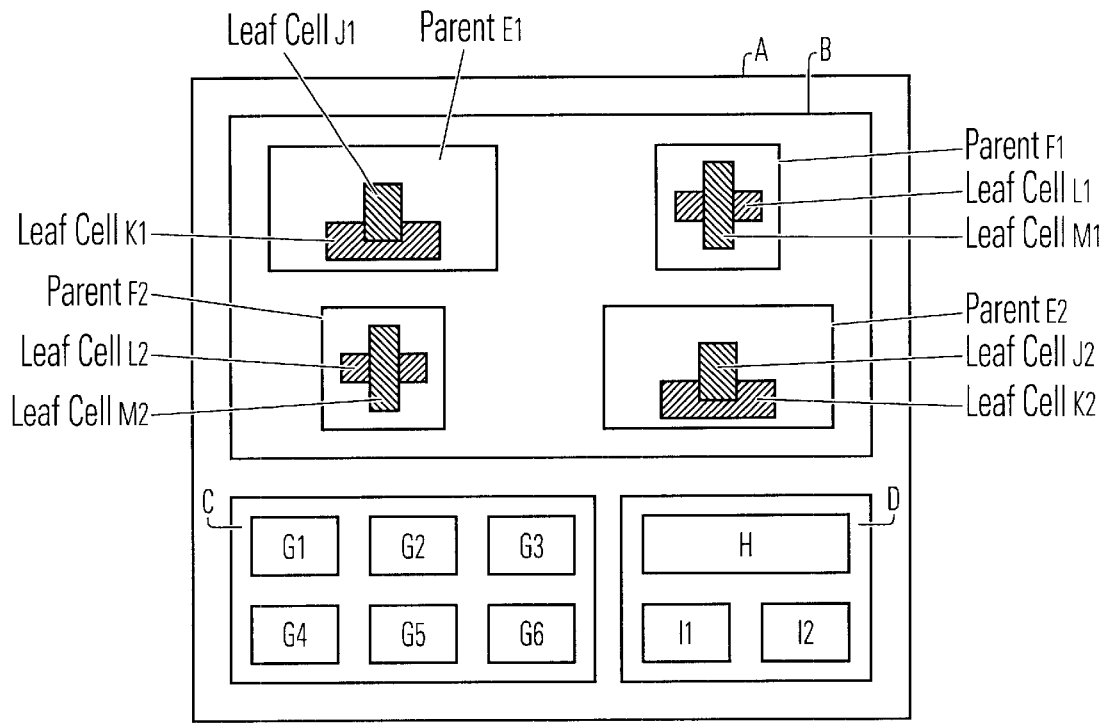
FIG. 1 illustrates a simple integrated circuit design layout and a hierarchical tree representation of the layout.
Figure 1:
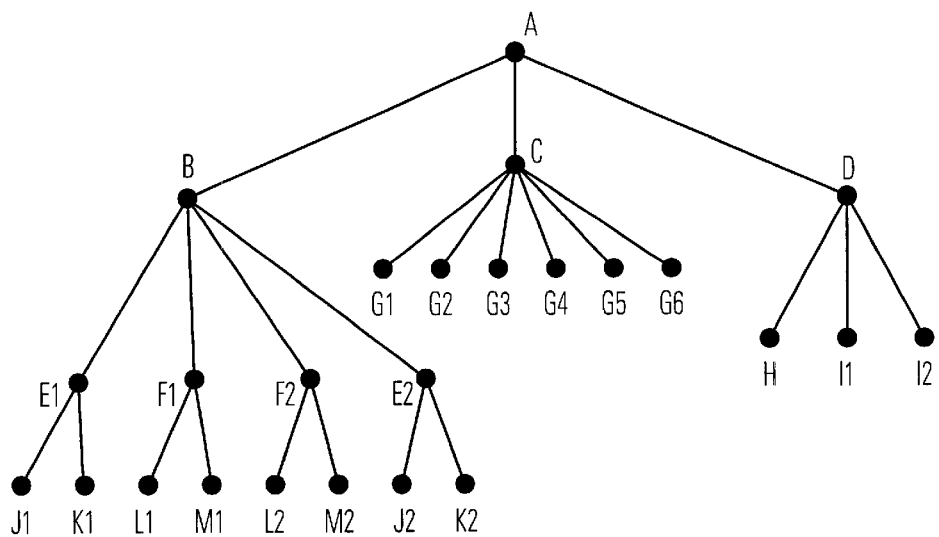
Figure 4:
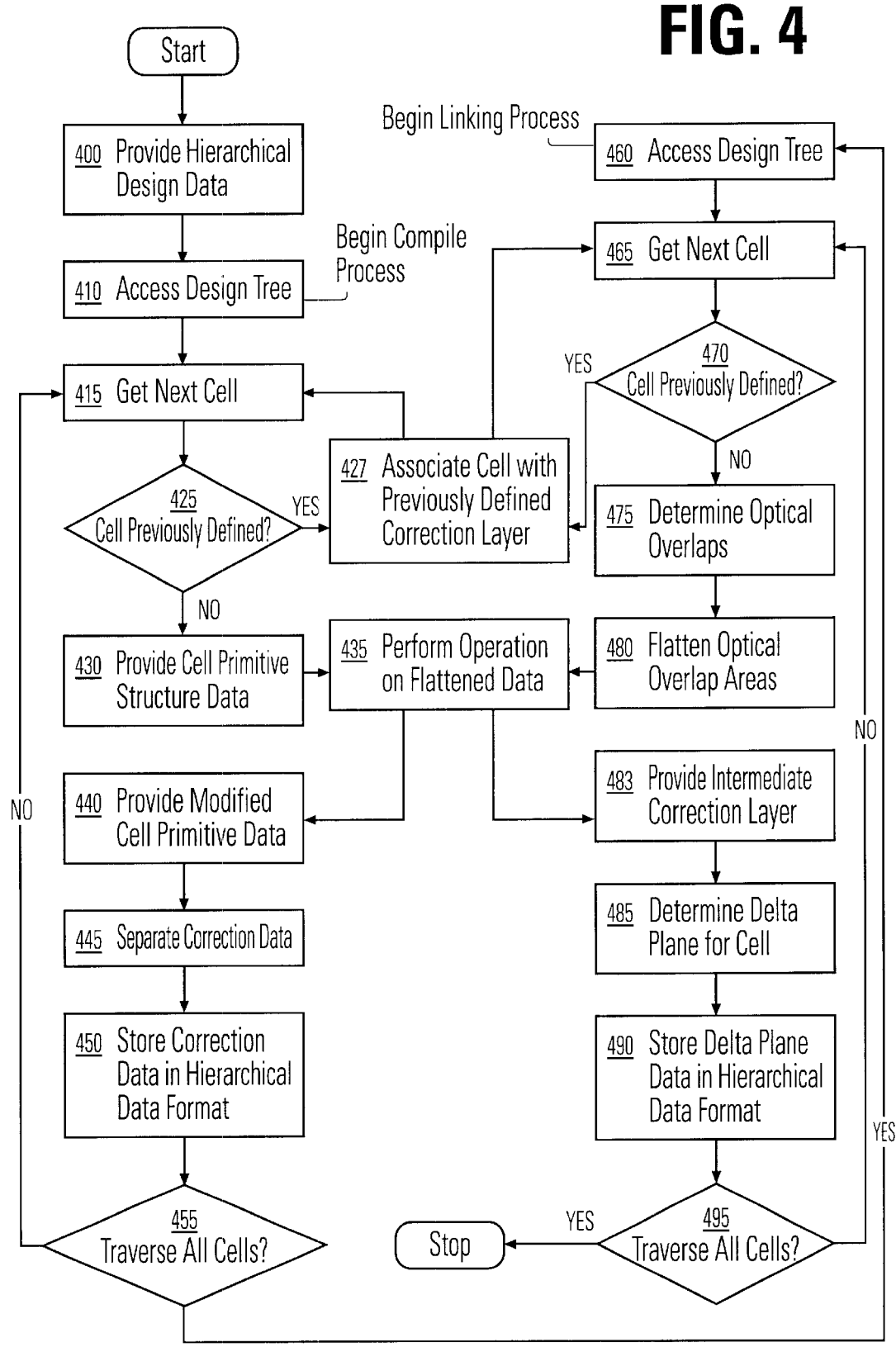
FIG. 4 illustrates in flowchart form, a method of performing a logical or arithmetic operation on a hierarchical integrated circuit design in which the hierarchical structure of the design layout is maintained according to one embodiment of the invention.
Figure 10A:
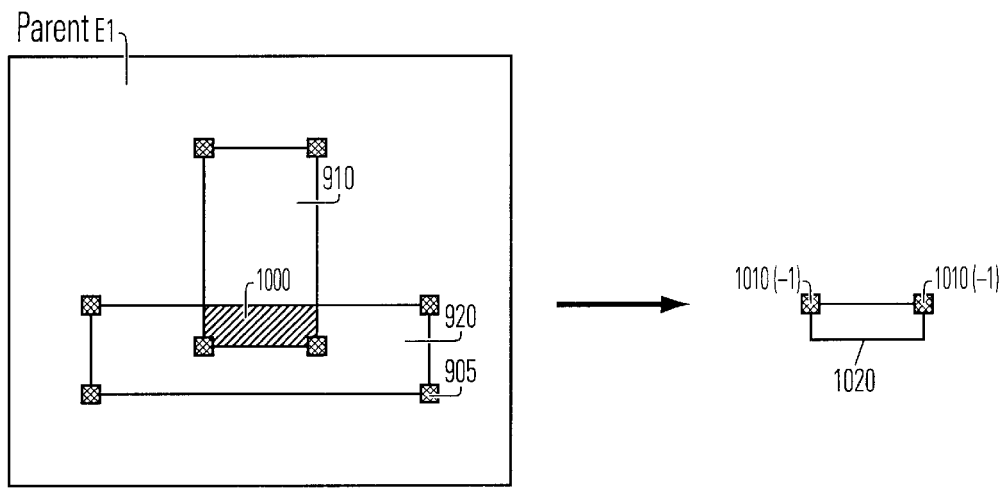
Figure 10B:
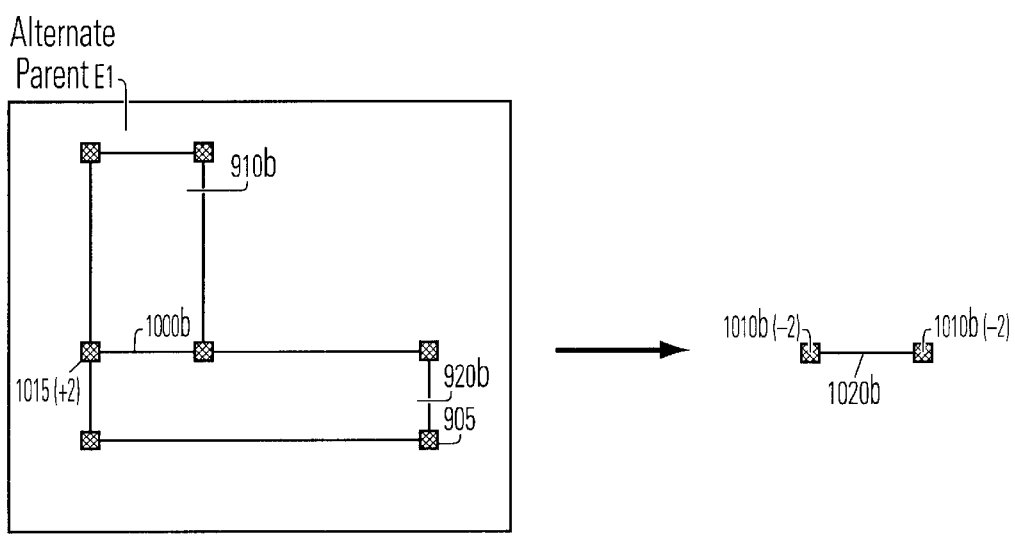

FIGS. 10(a)–(b) illustrate how the method of FIG. 4 would generate a correction layer for overlap areas within one of the parent cells of FIG. 1 for an OPC operation according to one embodiment of the invention.

Figure 11:
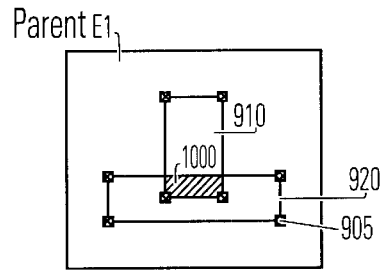
Figure 11:
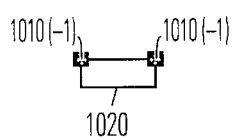
Figure 11:
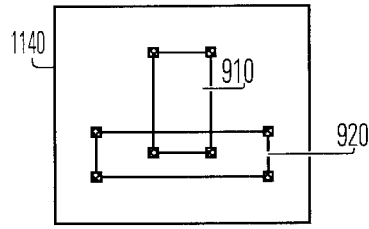
Figure 11:
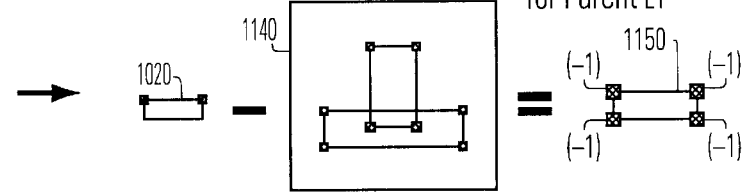
Figure 11:
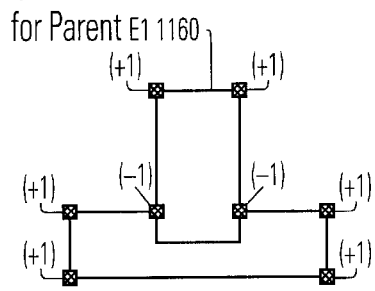

FIG. 11 illustrates how the method of FIG. 4 would generate the delta plane of one of the parent cells of FIG. 1 for an OPC operation according to one embodiment of the invention.

Figure 12:
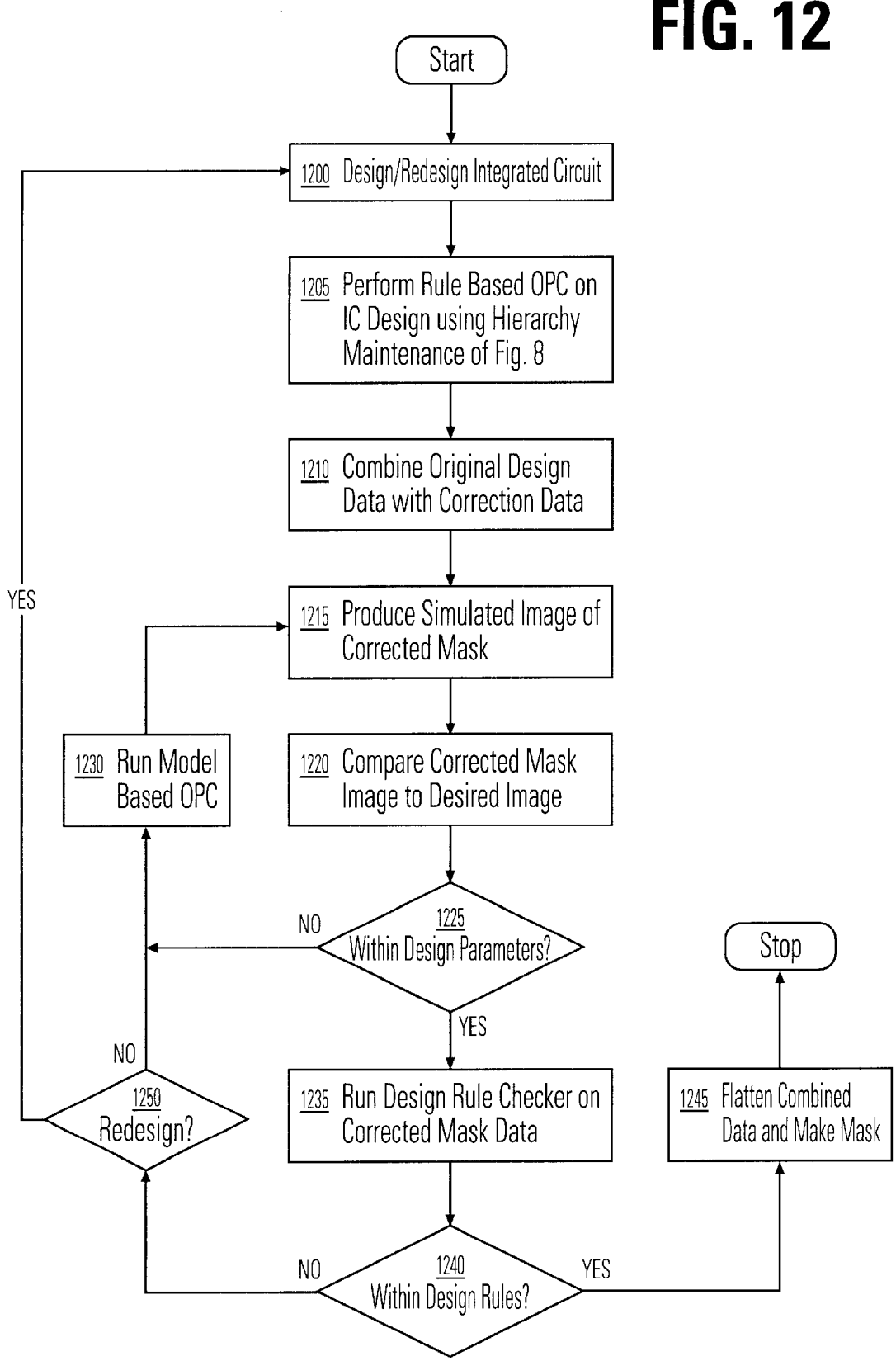

FIG. 12 illustrates a further method for providing OPC correction to an integrated circuit design layout using one embodiment of the present invention.

Figure 13:
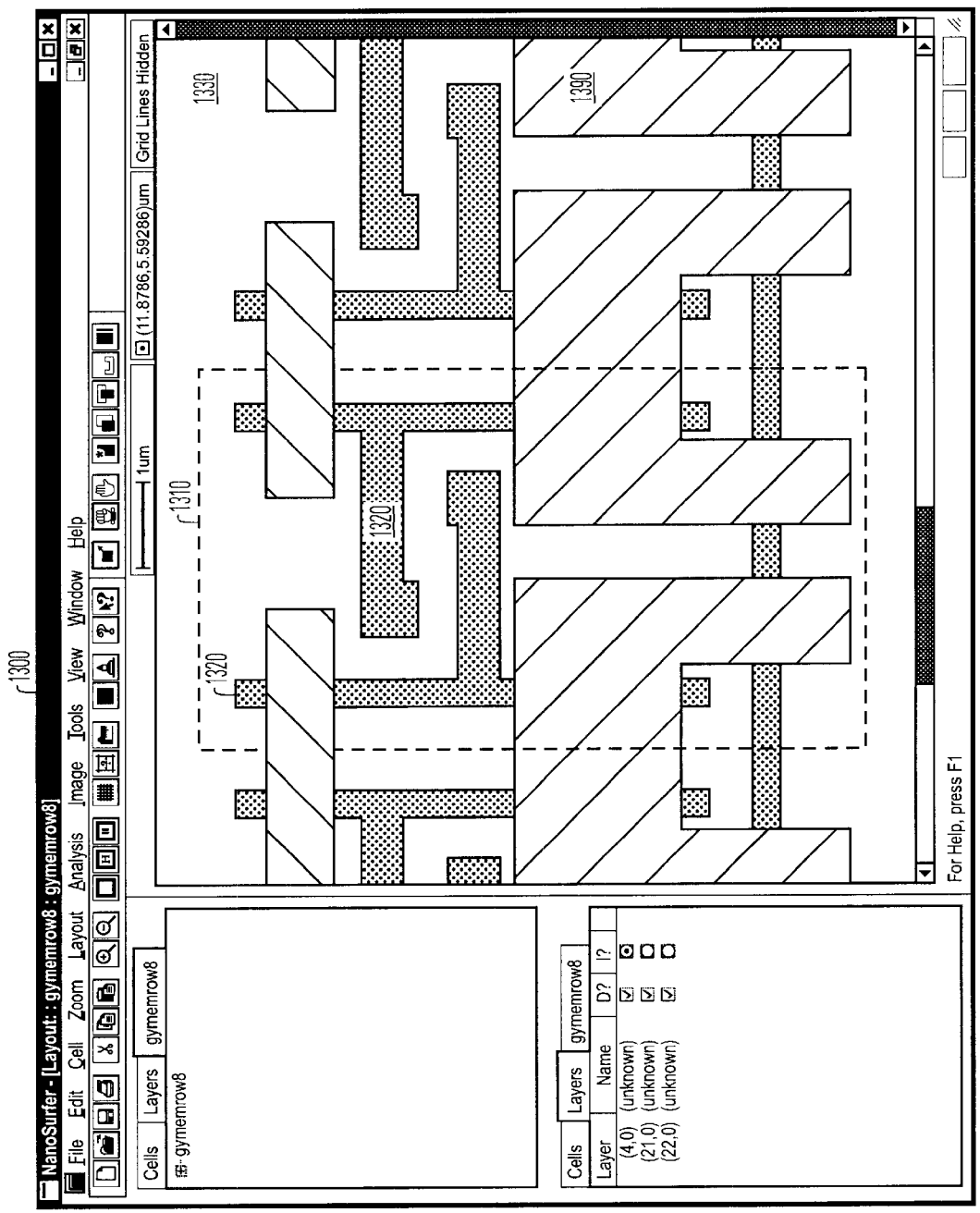

FIG. 13 illustrates an example screen snapshot of an input design layout from a computer system executing one embodiment of the invention to provide OPC correction of the input design layout.

Figure 14:
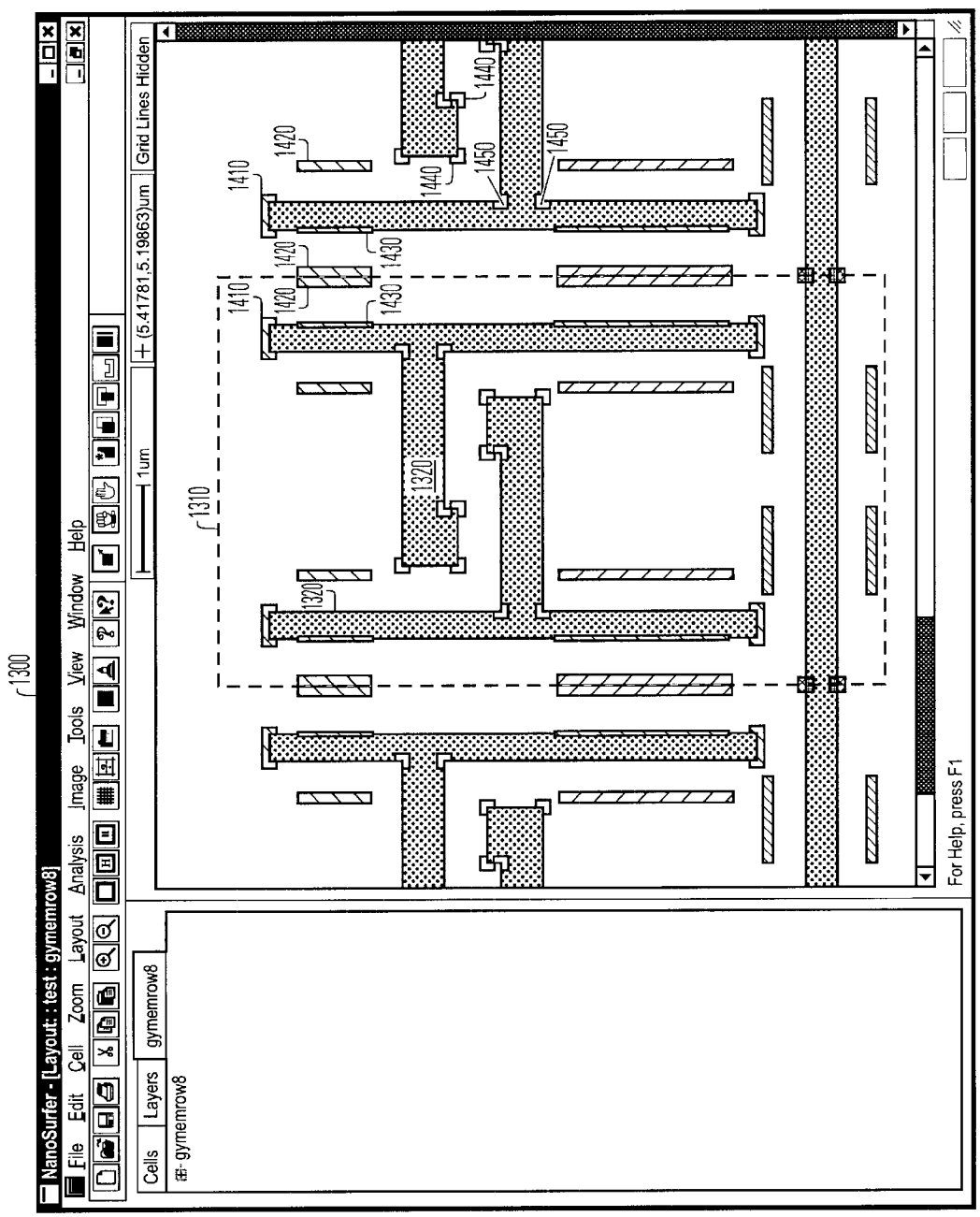

FIG. 14 illustrates an example screen snapshot of the final output from a computer system executing one embodiment of the invention to provide OPC correction to the input design of FIG. 13.

Figure 15:
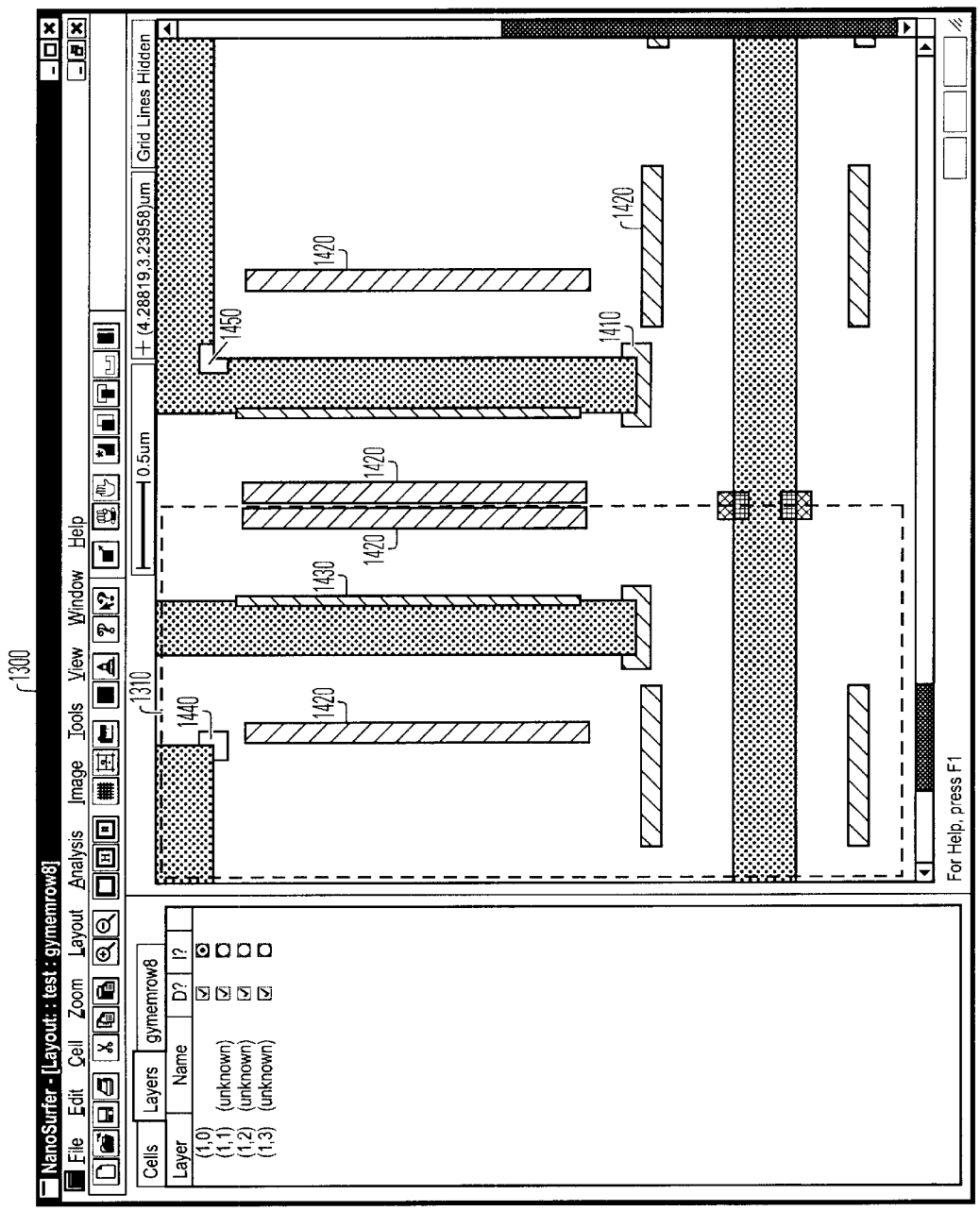

FIG. 15 illustrates a zoomed in example screen snapshot of the final output of FIG. 14.

Figure 16:
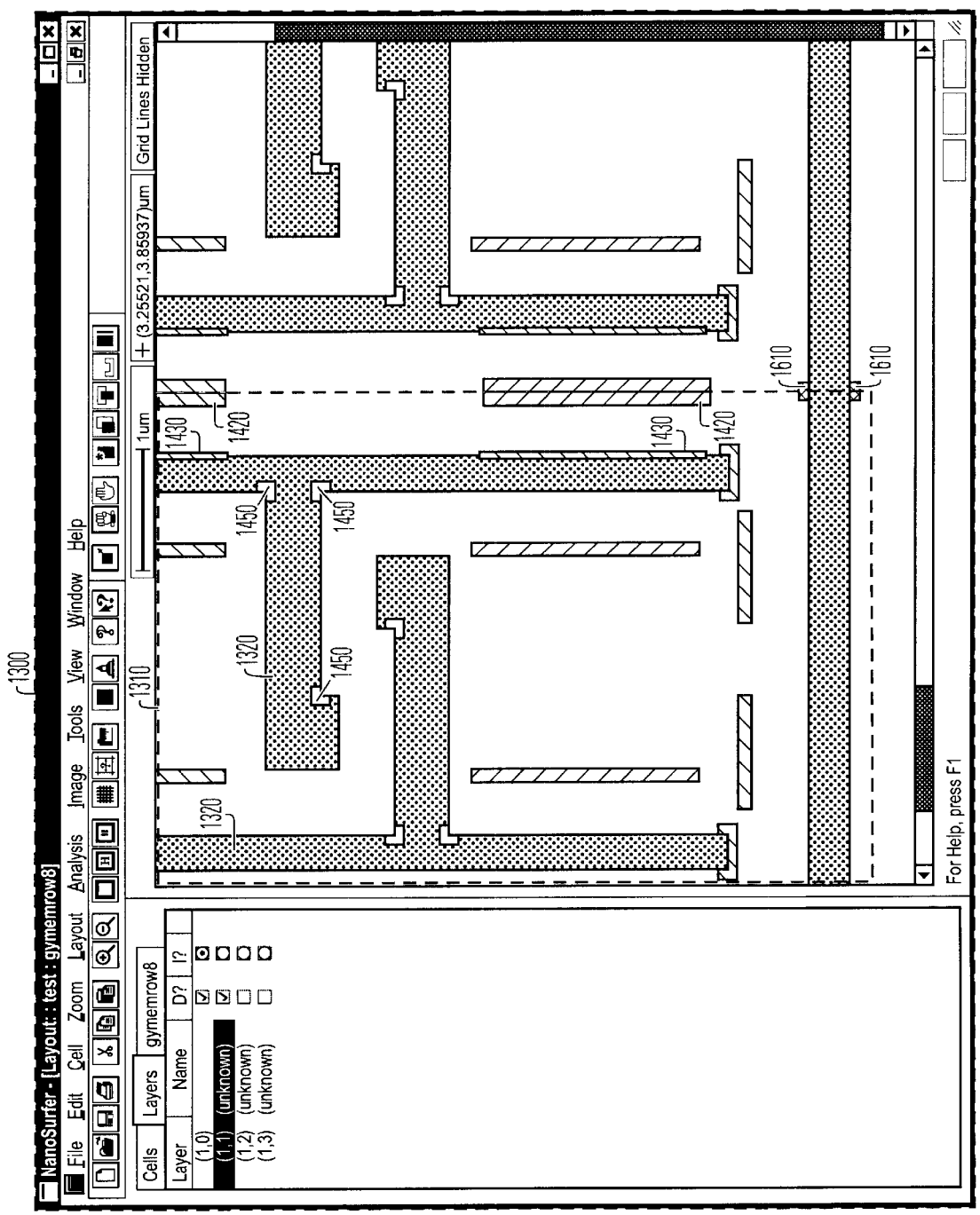

FIG. 16 illustrates an example screen snapshot of a −1 OPC correction layer from a computer system executing one embodiment of the invention to provide OPC correction.

Figure 17:
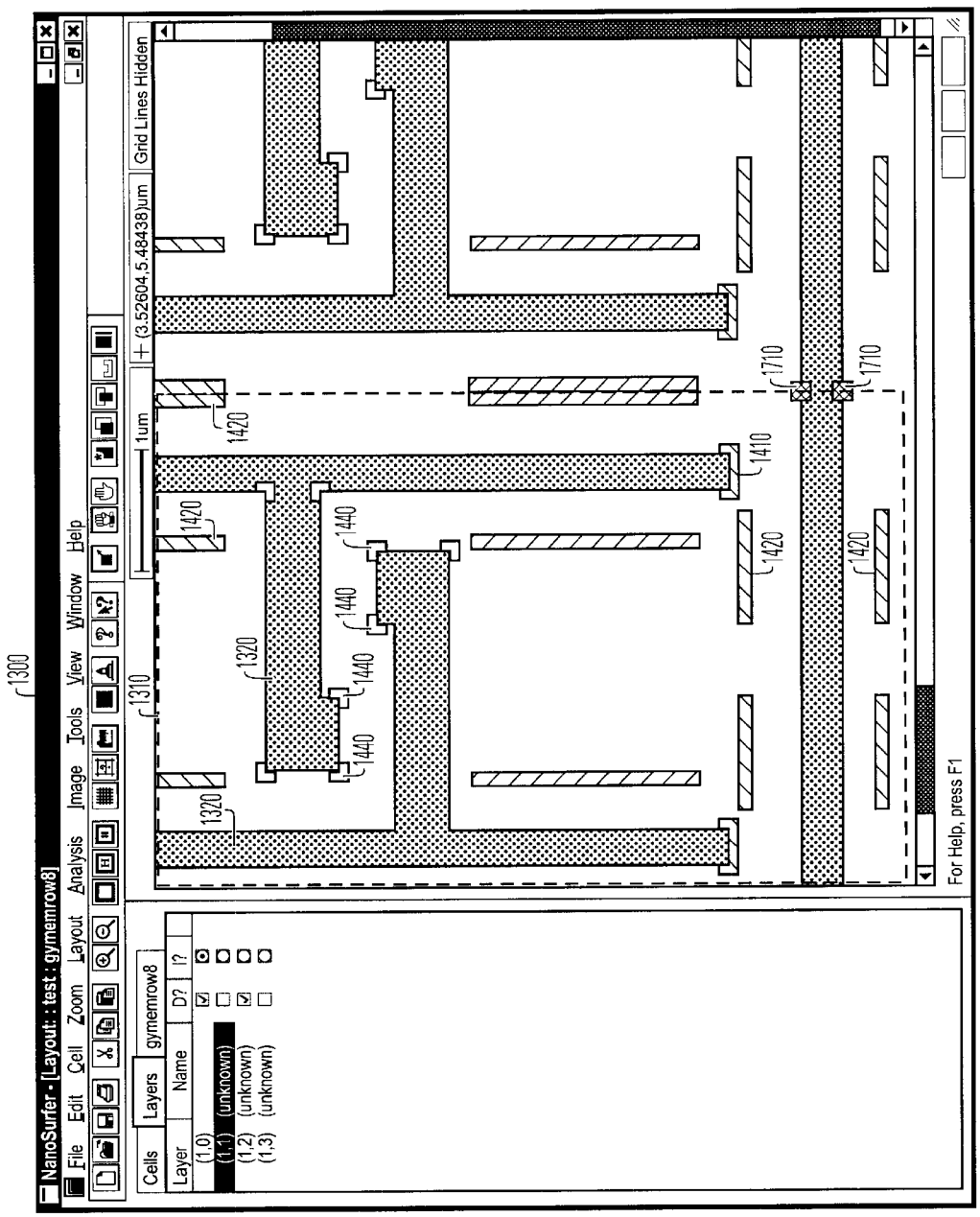

FIG. 17 illustrates an example screen snapshot of a +1 OPC correction layer from a computer system executing one embodiment of the invention to provide OPC correction.

Figure 18:
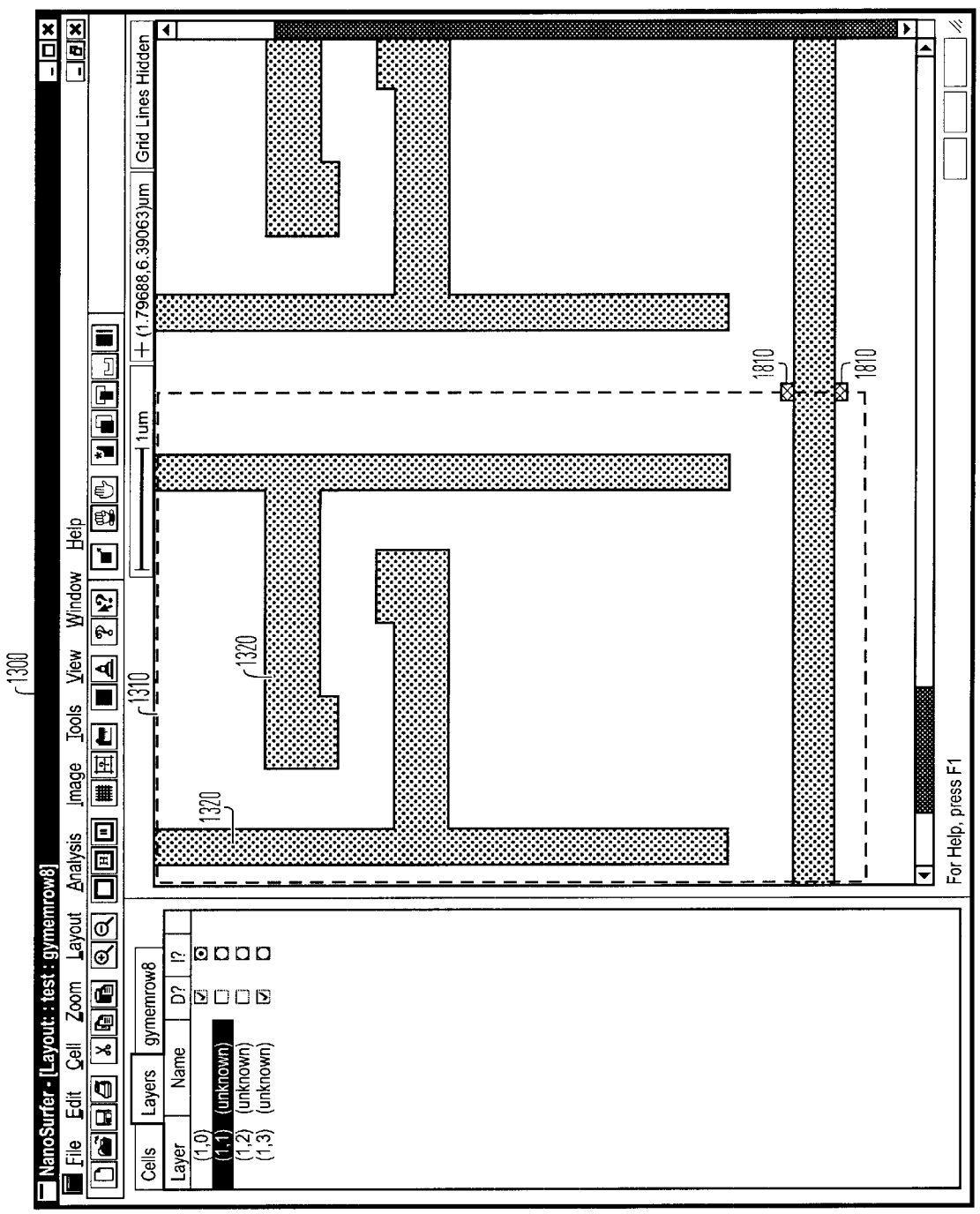

FIG. 18 illustrates an example screen snapshot of a −2 OPC correction layer from a computer system executing one embodiment of the invention to provide OPC correction.

Figure 19:
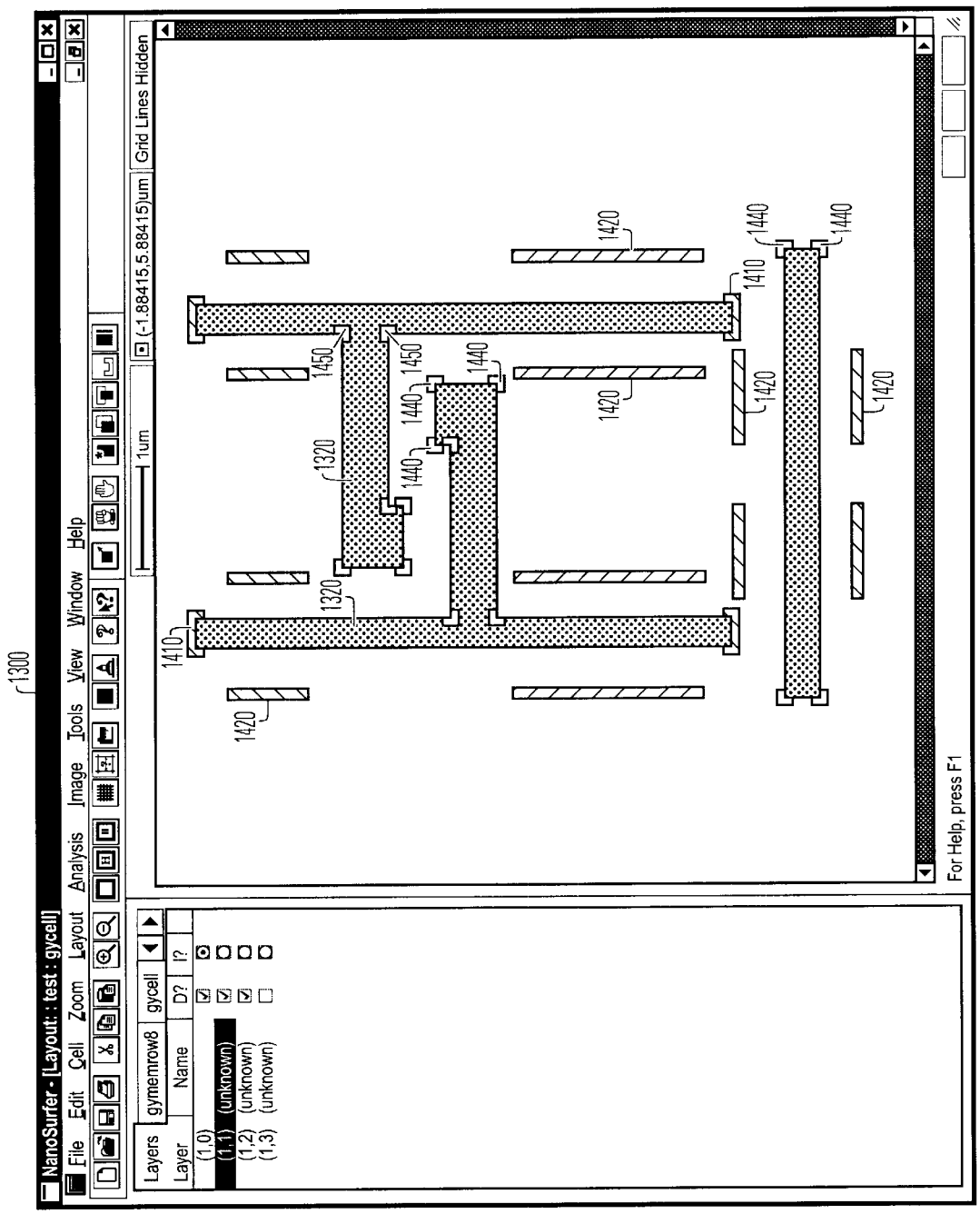

FIG. 19 illustrates an example screen snapshot of an individual cell that has been OPC corrected by a computer system executing one embodiment of the invention.

Although many details have been included in the description and the figures, the invention is defined by the scope of the claims. Only limitations found in those claims apply to the invention.

THE DETAILED DESCRIPTION

As described above, in the manufacture of photolithography masks, it is advantageous to flatten the data representing the IC design at the latest point in the actual manufacture of the masks. However, this flattening takes place earlier than desired in some instances. This is because the original layout for a complicated IC is typically manipulated after the original design is completed in order to perform one of a number of operations on the design. These operations include the performance of logical operations, the generation of optical proximity corrections, the generation of phase shifting masks, and the design rule checking of masks that have undergone these operations. Currently, these operations require some sort of flattening of the original design data in order to be performed—resulting in an earlier than desired flattening of the design data. This early flattening of data results in large increases in required data storage and a corresponding slow down in the performance of these operations. Further, because existing verification systems typically require the same input data hierarchies, operations which modify a design in a non-hierarchical manner make it difficult if not impossible to perform the important step of verifying these modified designs.

The present invention solves the above problems by providing for the performance of operations on an input hierarchical IC design such that the original true hierarchy of the design is maintained. Various embodiments of the invention include computer systems for verifying and correcting masks for use in integrated circuit manufacturing, and for performance of logical operations on design layouts. These embodiments receive hierarchical mask definition data defining the look of a particular mask. These embodiments then generate an output set of data. In one embodiment, this output data includes OPC corrected mask definitions. Other embodiments of the invention include actual masks generated using systems that perform OPC correction or mask verification techniques. Still other embodiments of the invention include computer readable media (e.g., hard disks, CDs, and other computer program storage tools) having computer programs that implement the OPC correction or mask verification techniques.

Before turning to a description of the present invention with respect to the figures, an overview of one embodiment of the concept of the present invention is provided. Thus, one embodiment of the invention utilizes a hierarchy preserver to receive a hierarchical definition of a layout and to generate one or more additional data layers that hierarchically include correction information provided by an engine which performs the operation on the design layout. These additional layers are then stored such that they are associated with each node in the hierarchic definition of that layer.

The following definitions are used in this specification: A correction plane is associated with any node (cell) in the hierarchy such that, by applying the correction plane to the flattened node, the output is the corrected design for that node. A delta plane is essentially the difference between a node's correction plane and the sum of all its immediate children's delta planes. Thus, the correction plane of a cell is equal to the delta plane for that cell plus the delta planes of the immediate child cells of that cell. Since the leaf cells of the hierarchy have no child cells, the correction plane for any leaf cell is equal to the delta plane of that leaf cell. In this manner, in one instance of the invention, the correction plane for each cell need not be stored since the overall correction to the layout can be provided by only storing the delta plane for each cell in the hierarchy.

The basic idea behind one embodiment of the present invention is described in two stages which comprise compilation and linking. In the compilation stage, corrections are generated for all geometry primitives in the hierarchy in accordance with the operation to be performed on the design layout. At the link stage, extra corrections due to the optical overlap of a parent cell's child cells and the parent cell's primitive geometry will be made. Therefore, only the additional correction is stored.

A delta algorithm computes the delta/additional information by considering only the children cell overlaps and the overlap between the parent's geometry and child cells. Only these areas are considered because only the overlaps would contribute to the additional correction change needed for the parent cell. The overlap area is not limited to purely geometry overlap, but also includes proximity overlap. By employing a more general definition, all proximity effects/corrections can be taken into account. The output of the delta algorithm for a cell will be now called its delta plane. The leaves of the hierarchical tree thus have delta planes equal to their correction planes.

At compile time, the correction planes for all leaves can be generated by providing the flattened data describing the geometry primitives for each leaf to an operation engine which performs the desired operation on the provided flattened data. At link time, if there is no subcell overlap, then the correction plane for this parent cell equals to the sum of its children's delta planes (and as described above their would be no additional delta plane information to be stored for this parent cell). If there is an overlap, the overlap area is flattened, and an intermediate correction plane for the flattened overlap area is generated. Subsequently, this intermediate correction area is used to subtract the sum of all correction planes of its children, and the difference is the delta plane which is stored hierarchically to correspond to the cell being linked.

The current GDS-II, and most other design database formats describing a full layout, include placing different mask and chip levels on separate layers. What is being introduced in various embodiments of the invention is a twist on the layer concept—that an arithmetic layer capable of both logical (e.g., XOR, AND) and arithmetic operations can be based upon. For instance, with respect to an OPC operation, a correction layer representing a particular OPC feature can be based on an arithmetic layer such that for example, "−1" means a negative serif, a "+1" means a positive serif, and "−2" means end-butting where the overlap is infinitesimal in one direction. During linking, all correction layers are arithmetically generated using an algorithm to compute the incremental or differential corrections throughout the structure. These delta planes, or arithmetic layers, are exposed in the database format as distinct layers (e.g., +1, −1, −2, etc. mapping to layers 1, 2, and 3). This allows the final correction layer for a parent cell to equal to the parent cell's delta plane and the incremental sum of all the delta planes of the parent cell's children and grandchildren and great-grandchildren, and so on, from the leaves' compile-time correction layer.

Hierarchical data management is also possible in the generation of corrections in an alternate embodiment of the invention in which the delta algorithm or arithmetic layers discussed above are not used. In this alternate embodiment, instead of taking and storing the difference between the correction layers of a parent cell and its children cells, a logical operation can be used to compare the correction between the parent and its children, and the "logical" instead of "arithmetic" difference is then stored at the parent cell.

Thus, as summarized above, the present invention provides a method and apparatus for data hierarchy maintenance in a system for mask description. A detailed description of preferred embodiments of the present invention is now provided with respect to the figures in which FIG. 1 illustrates a simple integrated circuit design layout 100 and a hierarchical tree representation of the layout 110. The circuit layout 100 comprises a final cell A which comprises Parent Cells B, C, and D. Parent Cell C comprises identical cells G1, G2, G3, G4, G5, and G6. Parent Cell D comprises cell H and identical cells I1 and I2. Parent cell B comprises identical Parent Cells E1 and E2, and identical Parent cells F1 and F2. Parent Cell E1 comprises Leaf cells J1 and K1 which comprise the primitive geometric structures illustrated in FIG. 1. Parent Cell E2 comprises Leaf cells J2 and K2 which comprise the same primitive geometric structures as cells J1 and K1. Parent Cell F1 comprises Leaf cells L1 and M1 which comprise the primitive geometric structures illustrated in FIG. 1. Parent Cell F2 comprises Leaf cells L2 and M2 which comprise the same primitive geometric structures as cells J1 and K1. The hierarchical tree layout 110 illustrates the aforementioned cells in a tree format with the leaf cells at the bottom of the tree and with the final cell A at the top of the tree. Each of the leaf cells is also sometimes referred to herein as a leaf node or a child cell, while each of the cells above the leaf nodes is sometimes referred to herein as a parent cell or simply a node. The integrated circuit design layout 100 of FIG. 1 is provided as a reference IC design with respect to which the embodiments of the present invention are described below. The simple IC illustrated in FIG. 1 is used for example only, as the embodiments of the invention described below are capable of being applied to any IC which is described in a hierarchical format.

Figure 2:
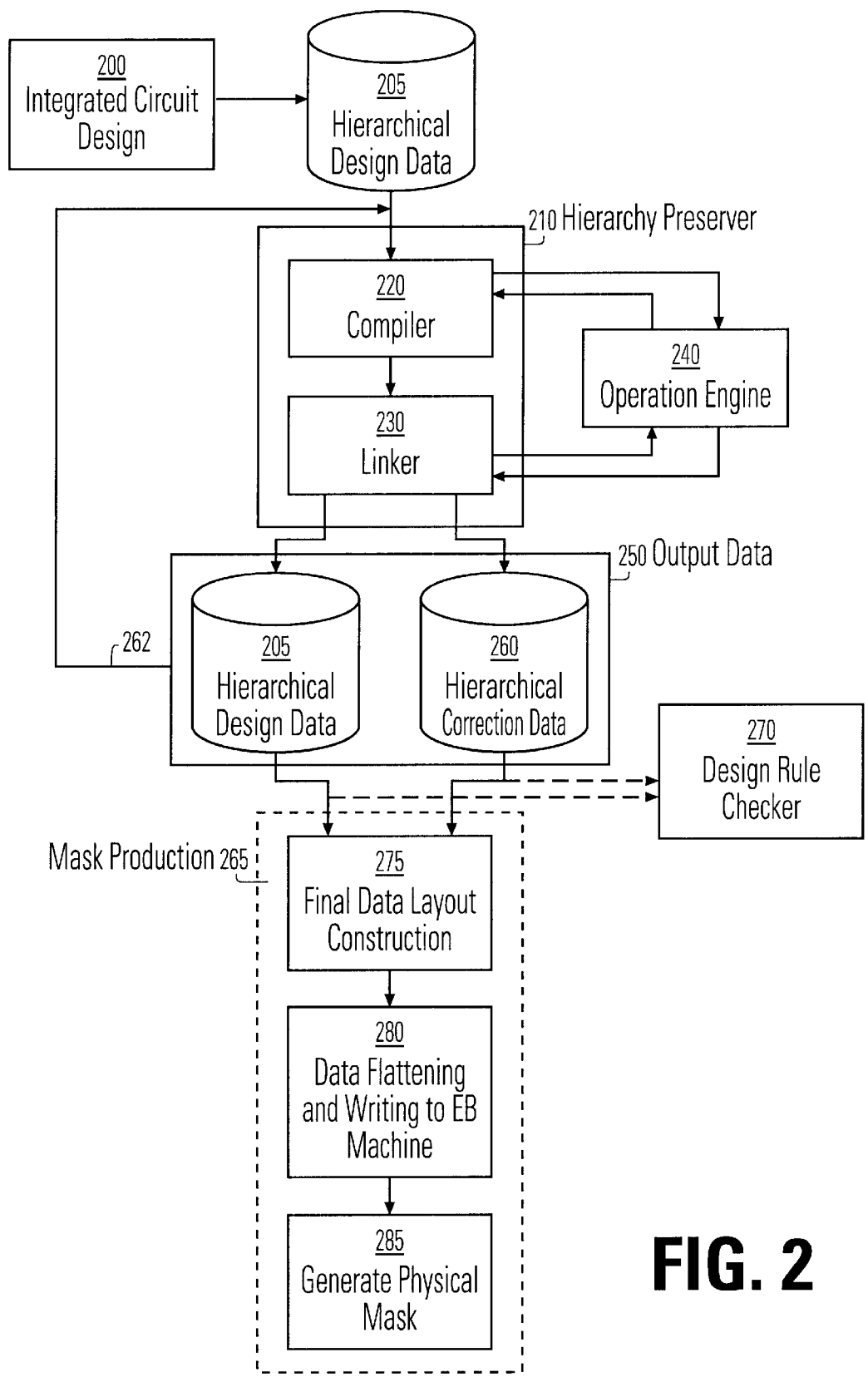
FIG. 2 illustrates a system level depiction of one embodiment of the invention.

FIG. 2 illustrates in block diagram form a system incorporating one embodiment of the present invention. The system described is one in which a logical or arithmetic operation can be performed on a hierarchically described input IC design such that the resultant modified IC design retains the original true hierarchy of the input design. The basic elements of one embodiment of the system comprise a hierarchy preserver 210 and an operation engine 240. The hierarchy preserver 210 comprises a compiler 220 and a linker 230.

The hierarchy preserver 210 of the system accepts hierarchical design data 205 which describes an integrated circuit design 200 as an input. The hierarchy preserver 210, in one embodiment, accepts hierarchical design data 205 in a GDS-II format. In other embodiments, the hierarchy preserver 210 accepts hierarchical design data 205 described in any hierarchical file format. The compiler 220 of the hierarchy preserver 210 acts in conjunction with the operation engine 240 to provide a correction data layer for the geometry primitives at each node of the design data 205. The generated correction data layers are representative of the changes to be made to the geometry primitives at each node in accordance with the operation being performed by the operation engine 240 as will be described more fully below. In one embodiment of the invention, the operation engine 240 performs a logical operation such as AND or NOT on the input design data 205. In another embodiment of the invention, the operation engine 240 performs optical proximity corrections on the input design data 205. In still another embodiment of the invention, the operation engine 240 performs design rule checking of the input design data 205.

After the compiler 220 has generated a correction data layer for each node of the input design data 205, the linker 230 acts in conjunction with the operation engine 240 to generate a delta plane for each node of the design. The delta plane for each cell is generated such that it is equal to the difference between the correction data layer information for the particular cell and the sum of all the correction data layers of the particular cell's children cells. In one embodiment, the delta plane for each cell is generated by a delta algorithm processed by the linker 230 which computes the delta/additional information by only considering overlaps within each cell. In one embodiment, these overlaps consist of the overlaps between a cell's children cells and any overlaps between a parent cell's own primitive geometry and that of it's children cells. In one embodiment, these overlap areas are not limited to purely geometry overlap, but also include proximity overlap. The process by which the linker 230 generates a delta plane for each node of the input design 205 will be described more fully below.

After the linker 230 has generated the delta planes, the hierarchy preserver 210 generates output data 250 which represents the input design 205 modified in accordance with the operation performed by the operation engine 240, where the output data 250 retains the original true hierarchy of the input design data 205. This output data 250 comprises the original unaltered hierarchical design data 205, and a hierarchical correction data file 260. The hierarchical correction data file 260 comprises the delta plane data for each node of the design data 205 such that when the design data 205 and the correction data 260 are combined a modified design is produced which represents the operation performed on the original design data 205 by the operation engine 240.

The hierarchical output data 250 can then be used for a number of purposes. First, it could be provided to the hierarchy preserver 210 on line 262 in order for a new logical or arithmetic operation to be performed on the output data 250. Further, since it is in hierarchical form, it can be provided to a conventional design rule checker 270 which accepts hierarchical data, in order that the new modified output design can be checked to verify that it meets the design rules for the particular integrated circuit being designed. Still further, the output data 250 can be used in mask production 265 by combining the design data 205 with the correction data 260 to construct a final data layout 275, flattening this combined data layout 280, and providing this flattened data to an electron beam machine to generate the actual physical mask which embodies the modified design data 285.

The generation of correction data layers and delta planes for each of the nodes of the design data 205 will now be developed further. With reference to FIG. 1, one embodiment of the compiler 220 accesses the design data using a depth wise traverse in which each branch of the final parent cell is accessed in order, and in which each branch is accessed from its leaf nodes upwards. Thus referring to FIG. 1, this embodiment of the compiler 220 would access the nodes of the integrated circuit layout 100 in the following order: J1, K1, E1, L1, M1, F1, L2, M2, F2, J2, K2, E2, B, G1, G2, G3, G4, G5, G6, C, H, I1, I2, D, and A. As the compiler 220 traverses the tree it provides the flattened data corresponding to the primitive geometry of each cell to the operation engine 240. The operation engine 240 performs an operation on the flattened data and returns the results of this operation to the hierarchy preserver 210. For instance, with respect to FIG. 1, if leaf cell J1 were compiled, the operation engine 240 would return flattened data J'=J+$\Delta$J. In one embodiment, the amount of data storage is decreased by the hierarchy preserver 210 which solves the aforementioned equation for $\Delta$J, and stores the value of $\Delta$J as the correction layer for cell J. This process is repeated for every cell in the design until the entire tree is traversed. The design data 205 is then linked by the linker 230 in the following manner. The tree is again traversed in the manner described above, and for each cell the overlap area is found and flattened. The flattened overlap area is then input to the operation engine 240 which in turn operates on the data and returns it to the hierarchy preserver 210. The linker 230 utilizes the return data from the operation engine 240 to produce an intermediate correction layer which is used by the linker 230 to generate a delta plane for each cell. The generation of the delta plane will be more fully described below with respect to FIGS. 6 and 10. The delta plane for each cell of the design is then stored in a hierarchical format corresponding to that of the input design data 205 in hierarchical correction data file 260.

In one embodiment of the invention as described in FIG. 2, the hierarchy preserver 210 may comprise a computer system executing program code stored on computer readable media that performs the functions of the compiler 220 and the linker 230. In one embodiment of the invention the operation engine 240 may also comprise a computer system executing program code stored on computer readable media. In one embodiment of the invention the hierarchy preserver 210 and the operation engine 240 comprise a single computer system executing a program code stored on computer readable media which performs the functions of the compiler 220, linker 230, and operation engine 240 together. In another embodiment, the hierarchy preserver 210 and the operation engine 240 comprise either a single computer system executing two or more different program codes or multiple separate computer systems executing two or more different program codes, one code for the functions of the hierarchy preserver 210, and a separate code for the functions of the operation engine 240. In this embodiment, the hierarchy preserver 210 may selectively provide data to the operation engine 240 through an API. With this embodiment, the hierarchy preserver 210 of the present invention can be modified to communicate and operate with currently existing operation engines 240 to provide the advantages of hierarchical data output.

The computer readable media referred to above may comprise any computer storage tools including but not limited to hard disks, CDs, floppy disks, and server memory. The computer systems executing the program code may, in the case of both the operation engine 240 and the hierarchy preserver 210, comprise any suitable computer system including a desktop computer running a Windows NT operating system or a Sun Solaris workstation for instance.

Figure 3:
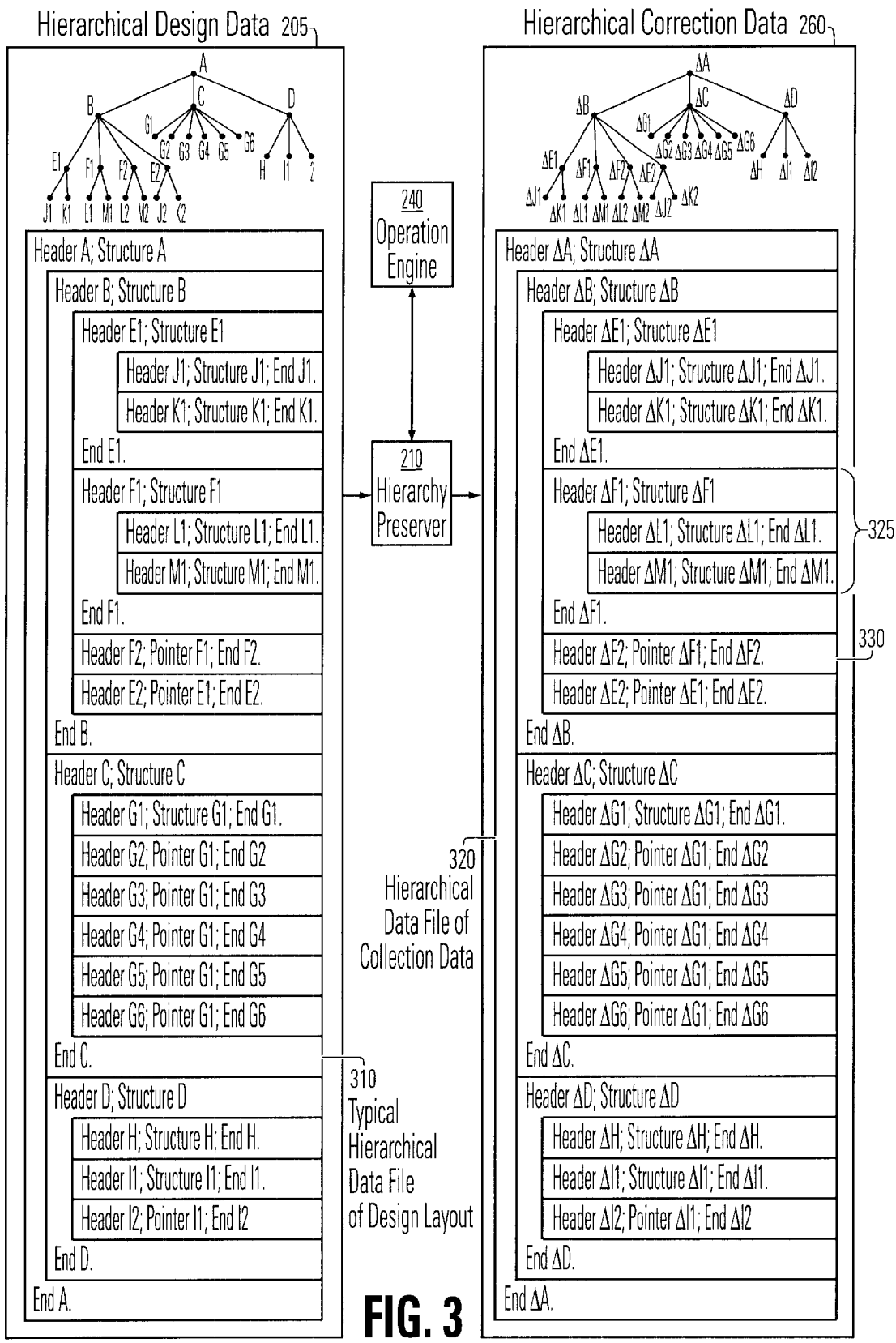
FIG. 3 illustrates a simple representation of a typical hierarchical data file that would be output from the system of FIG. 2.

Turning to FIG. 3, a simplified representation of a typical hierarchical data file that would be output from one embodiment of the system of FIG. 2 is illustrated. Hierarchical data file of correction data 320 represents a simplified version of the correction data that would be generated if the system of FIG. 2 were applied to operate on the simplified integrated circuit layout 100 of FIG. 1. As described above, hierarchical design data 205 is provided to hierarchy preserver 210 which operates in conjunction with operation engine 240 to provide hierarchical correction data 260. A simplified hierarchical data file of the design layout 310 is shown to illustrate the minimal effect the present invention has on the increase in data upon the performance of an operation. For, as shown, the hierarchical data file of correction data 320 is able to be stored in a structure which corresponds one to one with the input data file 310. This facilitates quick combination of the two data files 310 and 320 in order to perform other functions on the overall modified design such as mask production and design rule checking.

Note also that when a cell is traversed by the hierarchy preserver 210, the hierarchy preserver 210 determines whether or not that cell is identical to a cell that has already been traversed. If this is the case, then the hierarchy preserver does not take the processing time to directly determine a delta plane for that cell. Instead, the hierarchy preserver maintains the true hierarchy by providing a pointer to that cell's first instance of being defined. For instance, this is illustrated by the hierarchical data file of correction data 320 by cells F1 and F2 which are identical cell's as shown in FIG. 1. As described earlier, in one embodiment of the invention, the hierarchy preserver 210 traverses the design data 205 in a depth wise manner from the leaf nodes to the final parent cell. In this manner, F1 would be traversed before F2, and thus correction data ΔF1 would be generated and stored for this cell as indicated in file 320 by label 325. When cell F2 is traversed however, only a pointer to the correction data for F1 is stored and no direct correction data is processed for F2. This is indicated by label 330. In this manner, both processing time and data volume are decreased.

FIG. 4 illustrates in flowchart form, a method of performing a logical or arithmetic operation on a hierarchical integrated circuit design in which the hierarchical structure of the design layout is maintained according to one embodiment of the invention. At its simplest level the method comprises a compiling process followed by a linking process. A hierarchical design data layout is provided at block 400 and the design tree is accessed at block 410 in the manner previously described with respect to FIGS. 2 and 3. The compile process begins at block 415 wherein the hierarchical data for the first cell in the tree is obtained. Next, at block 425 it is determined whether or not the cell has been previously defined. If it has been previously defined, the obtained cell is associated with the previously defined correction data at block 427, and the next cell in the tree is obtained at block 415. If the cell has not been previously defined, the flattened primitive structure data of the cell is obtained at block 430 and provided to block 435 where an arithmetic or logical operation is performed on the flattened primitive data. The modified flattened primitive data is then provided to block 440, and this data is then processed at block 445 to separate the desired correction data as described earlier with respect to ΔJ of FIG. 2. The separated correction data is then stored in a hierarchical fashion corresponding to the original design data at block 450. At block 455, it is determined whether all of the cells have been traversed. If they have, the linking process begins at block 460, if not the compiling process continues at block 415 until such time when all the cells have been traversed and compiled.

The linking process begins in the same manner as the compile process with the accessing of the design tree at block 460. The process continues at block 465 wherein the hierarchical data for the first cell in the tree is obtained. Next, at block 470 it is determined whether or not the cell has been previously defined. If it has been previously defined, the obtained cell is associated with the previously defined correction data at block 427, and the next cell in the tree is obtained at block 465. If the cell has not been previously defined, the overlaps of the cell are determined at block 475 as discussed earlier with respect to FIG. 2. These overlap areas are then flattened at block 480 and the flattened data is provided to block 435 where the arithmetic or logical operation is performed on the flattened data as discussed previously. This operated upon flattened data is then used to generate an intermediate correction layer at block 483, and at block 485 a delta plane for the cell is generated which is then stored in a hierarchical data format at block 490. The delta plane is the only data which needs to be kept for each cell in the tree. For, as discussed above, given a parent cell and its child cells, the difference between the correction information for the parent cell and the sum of all of its children's correction data is equal to the delta plane. Thus, it follows then that the leaves of the hierarchical tree have delta planes equal to their correction planes determined at compilation. At block 495 it is determined whether or not all the cells in the tree have been traversed. If so, then the process is stopped, and the output data may then be used for a variety of functions as discussed previously—if not then the linking process continues at block 465 until all of the tree's cells have been traversed.

Figure 5:
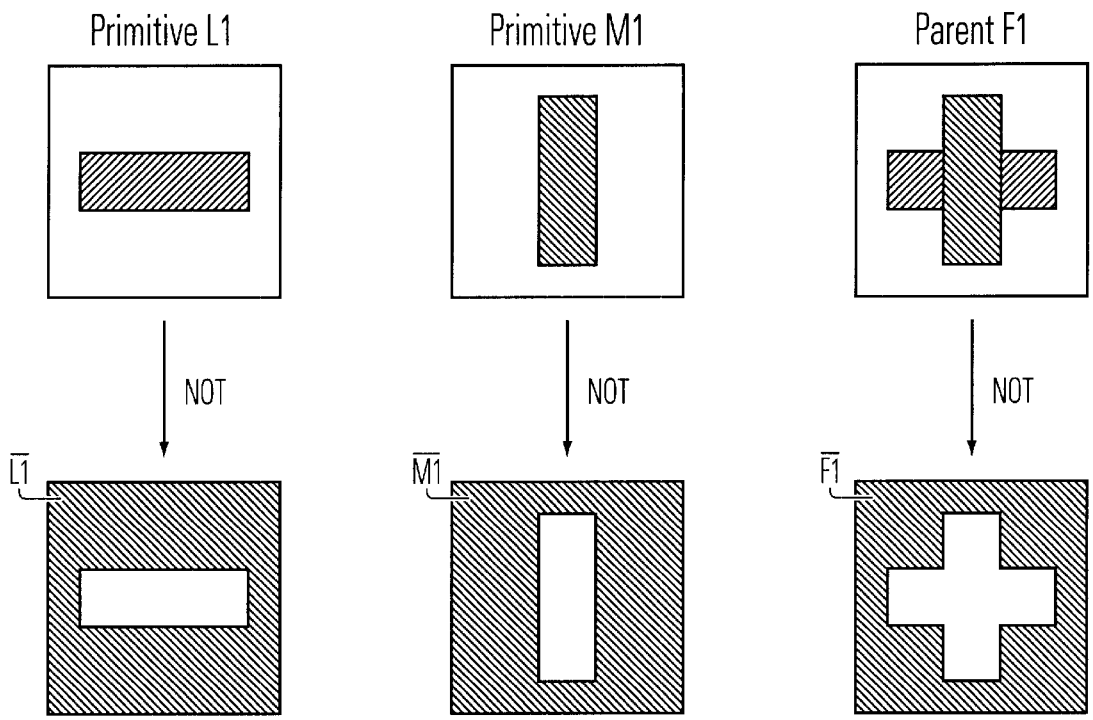
FIG. 5 illustrates how the method of FIG. 4 would provide for a logical NOT operation on one of the parent cells of FIG. 1 according to one embodiment of the invention.
Figure 5:
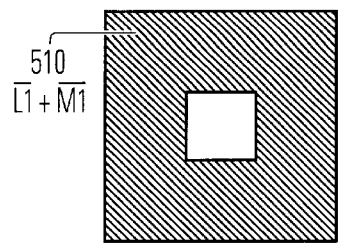
Figure 5:
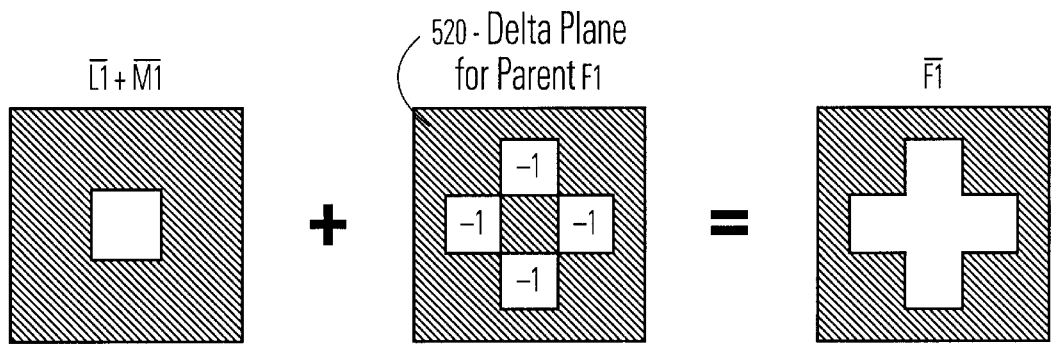

FIG. 5 illustrates how a specific embodiment of the present invention would perform a logical operation upon Parent cell F1 of FIG. 1. In this instance, suppose what was desired was to perform a logical NOT operation on Parent cell F1. The desired output is illustrated in FIG. 5 as F1(NOT). To perform this operation directly would entail performing a NOT operation on the flattened data representing Leaf L1 and a NOT operation on the flattened data representing M1 using the operation engine 240 of FIG. 2 in the manner described above with respect to block 435 of FIG. 4. The results of these operations could then be stored in a hierarchical manner such that the correction data is associated with the appropriate nodes. These results are illustrated in FIG. 5 as L1(NOT) and M1(NOT). Without the teachings of the present invention however, one can not obtain the desired F1(NOT) results simply by summing L1(NOT) and M1(NOT). This is illustrated by incorrect result 510 which is obtained by summing L1(NOT) and M1(NOT).

One embodiment of the present invention would operate to obtain the correct result F1(NOT) as follows. With reference to FIG. 2, the hierarchical design data 205, which in this simple example consists of the data representing Parent cell F1, is provided to the compiler 220 of hierarchy preserver 210. The compiler 220 provides the flattened data representing leaf L1 to the operation engine 240 which in this case performs a logical NOT operation on the supplied data and returns flattened data representative of the NOT of leaf L1. As described above, the compiler 220 then generates the correction data for L1 and stores this data in hierarchical correction data file 260. The same process is then repeated for leaf M1. As there is no primitive geometry associated with Parent cell F1, compilation of Parent F1 results in the generation of no correction data for F1. After the compilation of F1, the linker 230 operates to generate a delta plane 520 for Parent cell F1 during the linking stage as described more fully below with respect to FIG. 6. The delta plane 520 is generated such that, when summed with L1(NOT) and M1(NOT), the correct desired result F1(NOT) is obtained as shown in FIG. 5. This delta plane data is then stored hierarchically in hierarchical correction data file 260 such that it is associated with parent cell F1. This example is solely for illustration of the use of one embodiment of the present invention in the performance of a particular logical operation on a sample IC layout. As such, it is clear that this embodiment of the present invention could be used to perform any logical operation on any IC layout described in a hierarchical manner.

Figure 6:
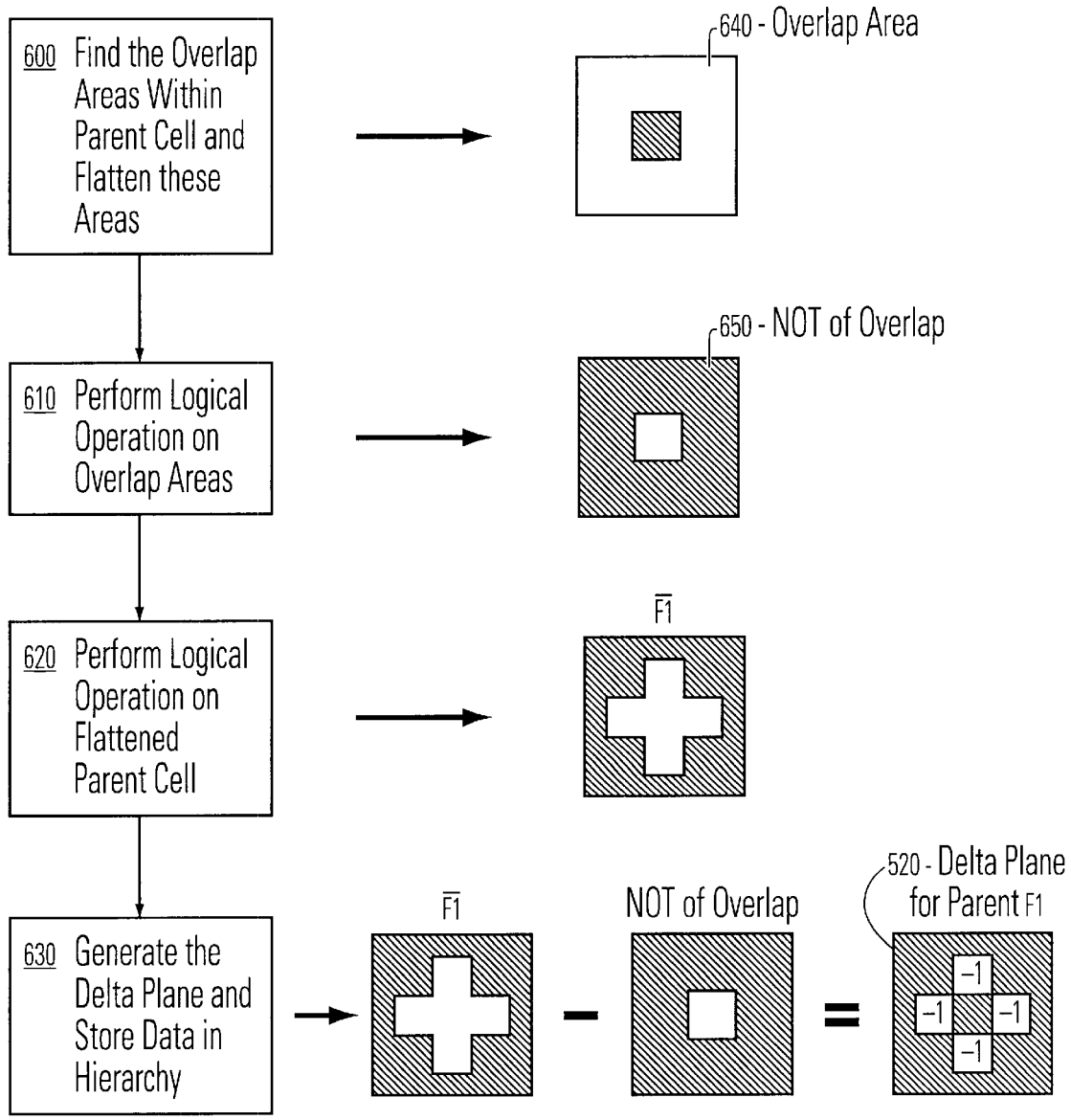
FIG. 6 illustrates how the method of FIG. 4 would generate the delta plane of one of the parent cells of FIG. 1 for a logical NOT operation according to one embodiment of the invention.
Figure 7A:
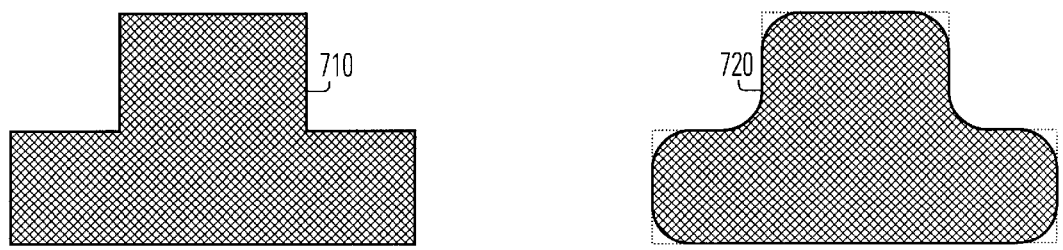
FIG. 7 illustrates examples of optical proximity corrections that can be made to design layouts.
Figure 7A:
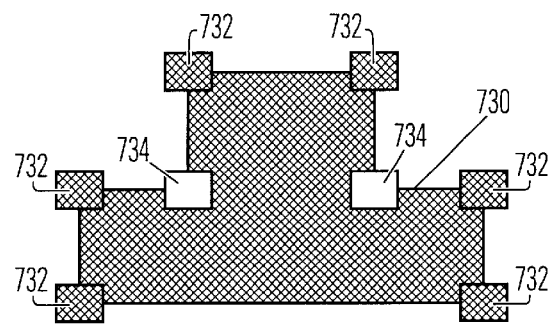
Figure 7B:
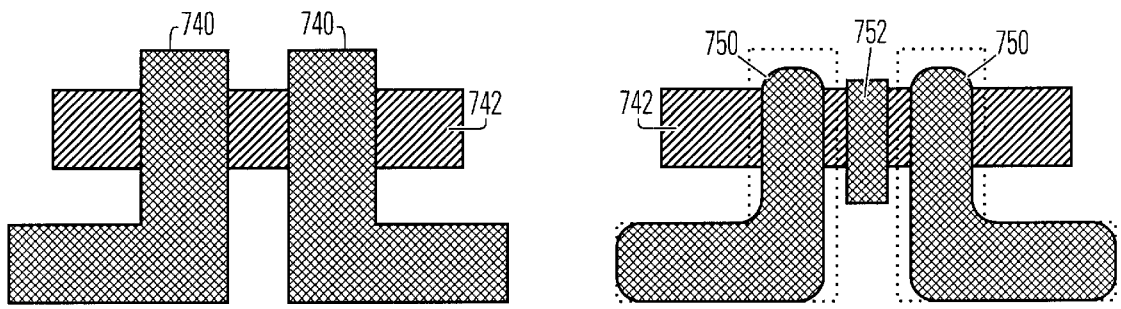
Figure 7B:
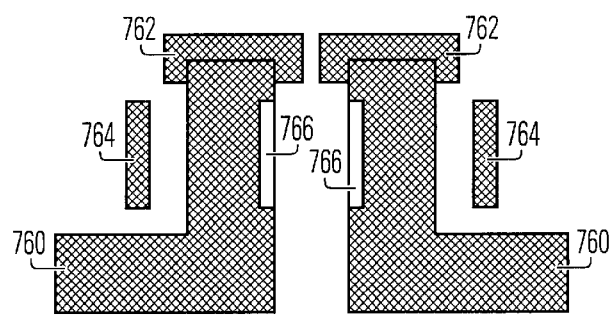

FIG. 6 illustrates heuristically how the delta plane 520 of FIG. 5 would be generated according to one embodiment of the present invention. With reference back to FIG. 2, after the operation engine 240 has performed a logical NOT operation on the flattened primitive data of leaf cells L1 and M1 respectively during the compile stage, the hierarchy preserver 210 operates during linking of Parent F1 to find the overlap areas within the parent cell and flatten these areas 600, which generates overlap area 640. This flattened data for overlap area 640 is then provided to operation engine 240 at block 610, and the NOT of the overlap 650 is generated by the operation engine 240. The logical NOT operation is then performed on the parent F1 to generate F1(NOT) in a flattened form at block 620. Lastly, the delta plane 520 is generated by taking the difference between the NOT of the overlap area 650 and flattened F1(NOT), and storing this delta data in hierarchical correction data file 260.

The use of the present invention in a system for generating OPC corrected layouts is now described. As stated previously, as the features of integrated circuit designs have become smaller and smaller, the resolution limits of optical lithography have had an increased effect on the exposure process. For instance, it has been observed that differences in pattern development of circuit features depend upon the proximity of the features to one another. Proximity effects occur when very closely spaced pattern features are lithographically transferred to a resist layer on a wafer. The light waves of the closely spaced features interact and, as a result, distort the final transferred pattern features. Another problem that occurs when feature sizes and spacing approach the resolution limit of the lithographic tool is that corners (concave and convex) tend to overexpose or underexpose due to a concentration or scarcity of energy at each of the corners. Other types of problems, such as over- or under-exposure of small features when large and small features are transferred from the same mask pattern, also occur.

Numerous methods have been developed to overcome the proximity effect problem. These methods include: precompensating mask line widths, varying photoresist layer thicknesses, using multi-layer photoresist processes, using electron beam imaging in conjunction with optical imaging, and finally, adding additional features to the original mask pattern to compensate for proximity effects. This last method is known as Optical Proximity Correction (OPC).

FIG. 7 illustrates examples of optical proximity corrections that can be made to design layouts. The additional features that are added to the original mask when OPC is utilized are typically sub-lithographic (i.e. have dimensions less than the resolution of the exposure tool) and thus do not transfer to the resist layer. Instead, they interact with the original pattern so as to improve the final transferred pattern and compensate for proximity effects. For instance, as shown in FIG. 7, a desired pattern 710 may appear as actual pattern 720 when lithographically transferred without compensation for proximity effects. Using OPC techniques, positive serifs 732 and negative serifs 734 may be added to the desired pattern 710 to form the mask 730 needed to compensate for proximity effects. Similarly, in FIG. 7, the effects of proximity distortions on a typical desired transistor gate pattern 740 are shown by actual transferred pattern 750 and 752. When OPC corrections represented by hammerheads 762, assist bars 764 and bias bars 766 are added to the original desired mask pattern, the original desired shape will be more accurately transferred. In the case of transistor gates, the hammerhead shapes 762 are designed to eliminate the effect of line end shortening to ensure that the polysilicon portion of the gate extends beyond the active region 742. The assist bars 764 are designed to compensate for the isolated gate effect which tends to decrease the width of the transferred gate pattern. Finally, the bias bars 766 are designed to eliminate the effect of densely packed gates which is shown by the additional transferred pattern 752. In some instances, currently existing OPC products utilize a rule-based algorithm to generate proximity corrections for a given geometry. In this type of system, the design layout is analyzed for predetermined layout patterns and one of the aforementioned types of OPC features are generated for that area of the design layout. However, unlike one embodiment of the present invention, previous OPC products are not capable of retaining the true hierarchical data structure of the original design layout.

An embodiment of the present invention which is capable of providing for the generation of OPC corrections for an IC design layout while retaining the true hierarchical data structure of the original design layout is described below with respect to FIG. 8. This description includes by reference the above discussions of FIGS. 2 and 4, as the system of FIG. 8 is a specific embodiment of the system and method described in these FIGS. respectively.

Figure 8:
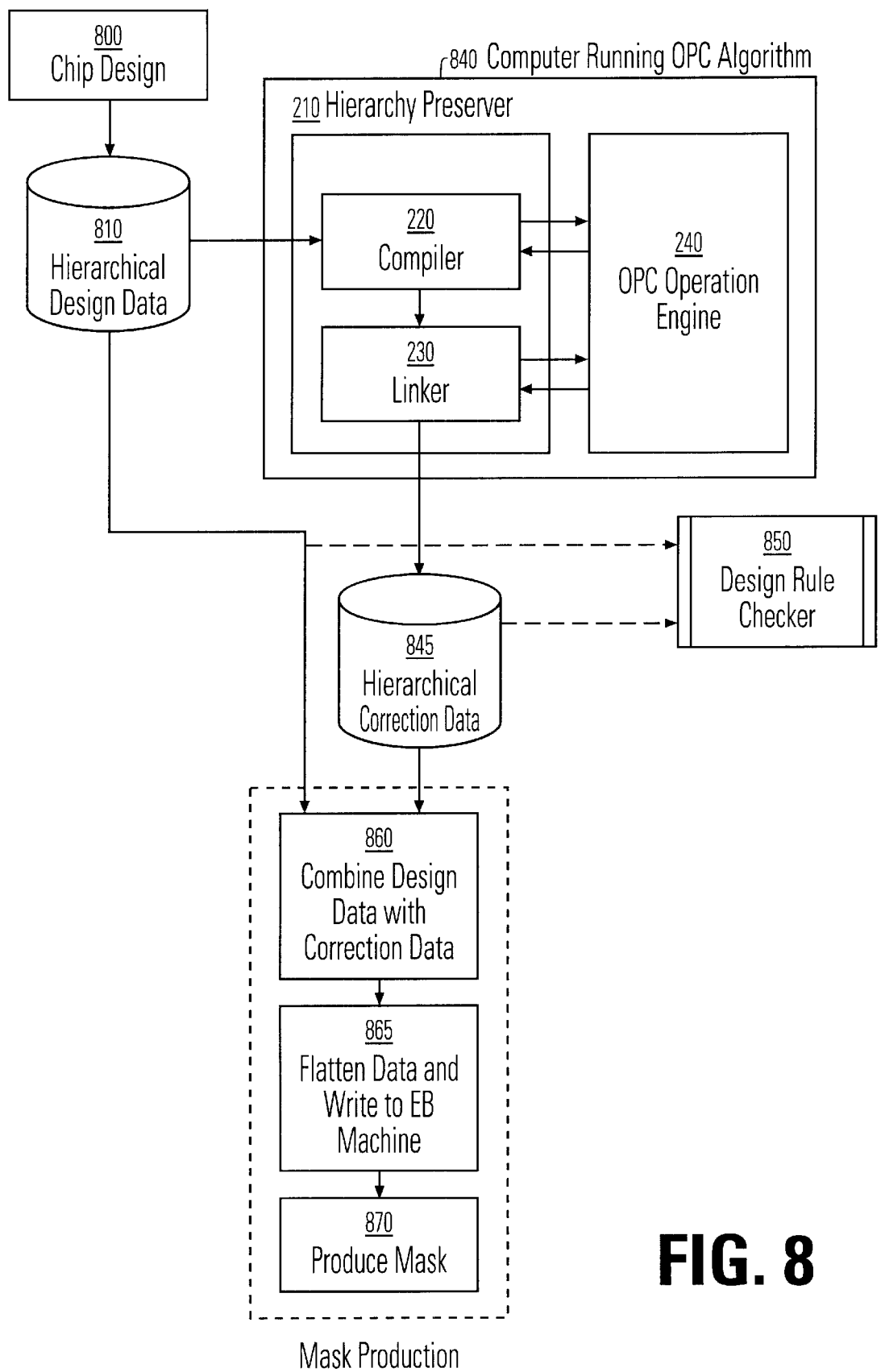
FIG. 8 is a depiction of a system for providing OPC correction to a design layout in accordance with one embodiment of the invention.

Referring to FIG. 8, an integrated circuit chip design 800 is represented by hierarchical design data 810, which in one embodiment is in a GDS-II data format. The design data 810 is provided as an input to a computer system running an OPC algorithm 840 which incorporates one embodiment of the present invention. The computer system 840 operates to produce hierarchical correction data 845 in the manner described previously with respect to FIGS. 2 and 4. In this respect, it can be seen that the computer system 840 comprises both the hierarchy preserver 210 and the operation engine 240 of FIG. 2, where the operation engine 240 of computer system 840 is a specifically defined OPC operation engine 240 that operates on the input design data 810 to provide for optical proximity corrections.

As shown in FIG. 8, the output hierarchical correction data 845 can be provided to a conventional design rule checker 850 along with the original design data 810 to design rule check the OPC corrected design. Similarly, the output could be used in the production of a lithography mask by combining the design data 810 with the correction data 845 as shown at block 860. This combined data can then be flattened and written to an EB machine as shown at block 865 in order for the EB machine to operate to produce the mask 870.

In one embodiment of the system of FIG. 8, the computer system 840 executes a computer program code stored on computer readable media that performs the functions of the compiler 220, the linker 230, and the OPC operation engine 240. In another embodiment, the computer system 840 comprises either a single computer system executing two or more different program codes or multiple separate computer systems executing two or more different program codes, one program code for the functions of the hierarchy preserver 210, and a separate program code for the functions of the OPC operation engine 240. In this embodiment, the hierarchy preserver 210 may selectively provide data to the OPC operation engine 240 through an API. With this embodiment, the hierarchy preserver 210 of the present invention can be modified to communicate and operate with currently existing OPC operation engines 240 to provide the advantages of hierarchical data output.

The computer readable media referred to above may comprise any computer storage tools including but not limited to hard disks, CDs, floppy disks, and server memory. The computer systems executing the program code may, in the case of both the OPC operation engine 240 and the hierarchy preserver 210, comprise any suitable computer system including a desktop computer running a Windows NT operating system or a Sun Solaris workstation for instance.

Operation engines which simply provide for OPC correction given a hierarchical input are well known in the field.

In one embodiment of the system of FIG. 8, the OPC engine 240 is a rule-based OPC engine capable of generating OPC features in a manner that is controllable by the user of the system. For instance, the user can define the correction rules to be applied, and the size of the features to be applied to the design layout. Further, in one embodiment of the system, the location and size of bias lines 766 can be dependent upon the size and pitch of the IC pattern features being corrected, and/or restricted to being used only in critical areas of the design such as transistor gate regions. Still further, in another embodiment of the system the OPC engine 240 is capable of applying assist features 764 either in a localized manner to critical areas such as transistor gates or to the entire IC design globally. Still further, in another embodiment, the OPC engine can selectively place correction features in critical areas while not placing those correction features in areas that do not require them for accurate circuit performance. In one instance of this embodiment, the OPC engine can restrict the placing of biasing and assist features to transistor gates, while leaving the non-critical interconnect regions of the polysilicon gate layer uncorrected. In another instance, the OPC engine distinguishes critical transistor gate line-ends and applies hammerhead corrections to these areas to alleviate line-end shortening. Lastly, in another embodiment of the invention, the OPC operation engine is capable of providing for OPC correction of Phase Shifting Masks such as those disclosed in the U.S. patent application entitled, "Phase Shifting Circuit Manufacture Method and Apparatus" having Ser. No. 08/931,921, filed Sep. 17, 1997, and invented by Fang-Cheng Chang, Yao-Ting Wang and Yagyensh C. Pati which was previously incorporated by reference herein.

Figure 9:
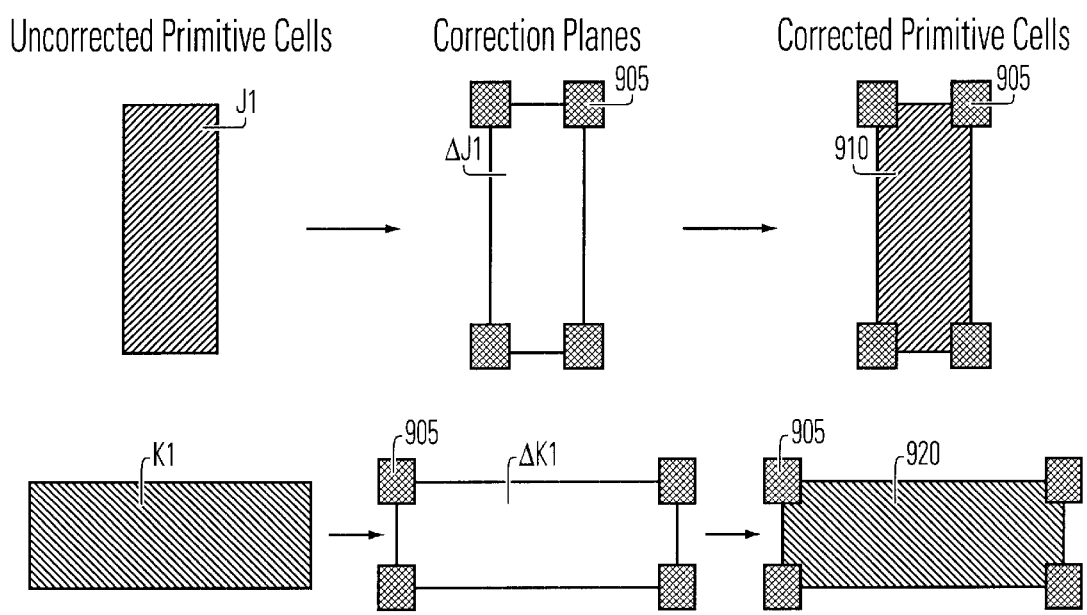
FIG. 9 illustrates how one embodiment of the system of FIG. 8 would provide for OPC correction of the primitive geometries of one of the cells of FIG. 1.

FIG. 9 illustrates how one embodiment of the system of FIG. 8 provides for OPC correction of the primitive geometries of leaf cells J1 and K1 of FIG. 1. Shown are uncorrected leaf cells J1 and K1 of Parent cell E1. The flattened primitive geometry data of J1 is provided to the hierarchy preserver 210, and the compiler 220 operates with the OPC engine 240 to provide a correction plane ΔJ1 in the manner discussed previously with respect to FIG. 2. In this case, the OPC engine has decided based on its rule definitions that the primitive geometry of J1 requires positive serifs 905 in order to provide the proper result when the mask is produced and used to expose a wafer. The same process is performed on the flattened primitive geometry of K1 to generate correction plane 66 K1, again comprising positive serifs 905. Each of these cells is then linked by the linker 230 as discussed previously to generate delta planes for each cell. Since these cells are leaf nodes and have no overlap areas, their respective delta planes are equal to their compiled correction planes. Also illustrated are corrected leaf cells 910 and 920 which represent J1+ΔJ1, and K1+ΔK1 respectively.

FIGS. 10(a)–(b) illustrate how the method of FIG. 4 would generate an intermediate correction layer for overlap areas within Parent cell E1 of FIG. 1 for an OPC operation according to one embodiment of the invention. FIG. 10(b) illustrates the overlap area 1000 between corrected leaf cell J1 910 and the corrected leaf cell K1 920. As discussed above with respect to FIGS. 2 and 4, during the linking process for cell E1, this overlap area is determined and the data corresponding to this area is flattened. The flattened overlap area is then provided to the OPC operation engine 240 which operates on the data to provide an intermediate correction plane 1020. Note that in the case described here where the primitive structures overlap a discrete amount, negative serifs 1010 are provided for the intermediate correction plane. In the situation described below with respect to FIG. 10(b), an alternate parent E1 is illustrated in which the corrected leaf cells K1 and K2 shown as 910b and 920b respectively. This situation illustrates an infinitesimal overlap between the two corrected primitive geometries. In one embodiment of the invention, an intermediate correction plane 1020b is provided for these infinitesimal overlap situations such that a –2 layer is provided to compensate for end butting effects.

FIG. 11 illustrates how the method of FIG. 4 would generate the delta plane of parent cell E1 of FIG. 1 for an OPC operation according to one embodiment of the invention. As described by block 1100, at the link stage for cell E1, the overlap areas within E1 are determined and the area data is flattened. This is illustrated as overlap area 1000. Next, as described by block 1110, an intermediate correction plane 1020 for this overlap area 1000 is generated as described above with respect to FIG. 10(a). At block 1120, the correction planes 910 and 920 of all the children cells of E1 are summed to generate summed children correction data 1140. The last step as described by block 1130 is to generate the delta plane 1150 for cell E1 and store this data hierarchically. This is accomplished in one embodiment by subtracting the summed children correction data 1140 from the intermediate correction plane 1020 to obtain the delta plane 1150. Also illustrated in FIG. 11 is the final correction plane 1160 for cell E1 which as defined earlier represents the total of the corrections needed to be applied to the cell's design data in order to properly apply the particular operation, which here is OPC, to the cell. The correction plane 1160 comprises the E1's delta plane summed with the correction planes 910 and 920 of its children J1 and K1 respectively.

FIG. 12 illustrates a further method for providing OPC correction to a design layout using one embodiment of the present invention. At block 1200 an integrated circuit design layout is first provided. The hierarchically formatted design data corresponding to this design layout is then provided to a system which performs a rule based OPC correction on the design data in accordance with the system of FIG. 8 as shown at block 1205. The system of FIG. 8 generates an output of hierarchical correction data as described above, and this correction data is combined with the original design data to generate a hierarchically described rule-based OPC corrected design data as shown at block 1210. Using this corrected design data a simulated image of the mask which this corrected design data would produce is generated at block 1215. This simulation can be generated utilizing a Hopkins equation based simulation device such as that described generally in the U.S. provisional patent application entitled, "Mask Verification, Correction, and Design Rule Checking" having serial No. 60/059,306, filed Sep. 17, 1997, and invented by Fang-Cheng Chang, Yao-Ting Wang and Yagyensh C. Pati, U.S. patent application entitled, "Mask Verification, Correction, and Design Rule Checking", filed Sep. 16, 1998, and invented by Fang-Cheng Chang, Yao-Ting Wang and Yagyensh C. Pati, and also more specifically in the U.S. patent application entitled "Visual Inspection and Verification System", filed Aug. 7, 1998, and invented by Fang-Cheng Chang, Yao-Ting Wang, Yagyensh C. Pati, and Linard Karklin, each of which were previously incorporated by reference herein.

The simulated image of the corrected mask is then compared to the desired design image at block 1220 to determine whether or not the initial rule based OPC correction was sufficient to correct the design to within a set of user defined design parameters as shown at block 1225. Methods for performing this comparison are disclosed in the aforementioned United States provisional patent application entitled, "Mask Verification, Correction, and Design Rule Checking." If the result of the comparison is that the design parameters have been achieved, the corrected design data can then be input to a design rule checker which analyzes the corrected design for any violations of the established design rules for the particular integrated circuit design as shown at block 1235. If the corrected design is within design rules, the corrected design data can then be flattened and a mask can be produced using an EB machine as shown at block 1245. If the design rules have not been met, a decision must be made as to whether or not to redesign the mask as shown at block 1250.

If the decision is not to redesign, but to try and fix the problem by continuing with the iterative correction process, a model based OPC algorithm is then run on the corrected design. Similarly, if the original corrected design data did not meet the design parameters of block 1225, the original corrected design data is input to a model based OPC algorithm. The model based OPC algorithm is then used to perform more detailed specific corrections to the original corrected design as shown at block 1230. The model based OPC corrected design can then be provided to block 1215 where a simulated image of the model based OPC corrected design is produced and once again compared to the desired image. Before entering the OPC corrected design into a conventional design rule checker product for analysis of the design, the simulated image of the model based OPC corrected design must be manipulated into a format that is acceptable by a conventional design rule checker. One way of doing this is to generate a Manhattan geometry representation of the simulated image based on an edge checking technique as described more fully in the aforementioned and incorporated United States provisional patent application entitled, "Mask Verification, Correction, and Design Rule Checking" and the United States utility patent application of the same name. This whole process can be continued until a corrected design is produced which meets both the user defined design parameters and the circuit specific design rules.

In one embodiment of this process, the model based OPC algorithm is capable of responding to user defined input. For instance, in one embodiment, the user can control the complexity level of the corrections he wants to be applied in order to control data volume and overall process speed. Similarly, in another embodiment the user can control the size of correction features to be applied by the model based algorithm. Still further, in another embodiment, the user can define the correction criteria to be applied by the algorithm.

The remaining FIGS. 13–19 illustrate example screen snapshots from a computer system executing one embodiment of the present invention to provide OPC corrections for a hierarchical input IC design layout. For instance, FIG. 13 illustrates an example screen snapshot of the input design layout which is to be OPC corrected. The user interface 1300 of the design program comprises a design window 1330 in which is illustrated a portion of the IC design layout to be corrected. The design layout includes a diffusion layer 1390 and a layer of polysilicon structures such as primitive structures 1320. A cell 1310, similar to the sample parent cells E1 and F1 of FIG. 1, is also depicted in design window 1330.

FIG. 14 illustrates an example screen snapshot of the final output from a computer system executing one embodiment of the invention to provide OPC correction to the input design of FIG. 13. The design window 1330 of user interface 1300 shows a cell 1310 comprising primitive structures 1320 which have been OPC corrected. The cell 1310 comprises OPC features such as hammerheads 1410, assist lines 1420, bias lines 1430, positive serifs 1440, and negative serifs 1450. The output depicted in FIG. 14 is representative of all of the corrections which would have to be made to compensate for all OPC effects on the entire design. Thus, these corrections represent the final linked output of this embodiment of the present invention in which all overlaps between cells in the hierarchy have been resolved and compensated for. The OPC features depicted in FIG. 14 are shown in greater detail in FIG. 15 which is a zoomed in example screen snapshot of FIG. 14.

FIG. 16 illustrates an example screen snapshot of a −1 OPC correction layer from a computer system executing one embodiment of the invention to provide OPC correction. This layer contains corrections to cell 1310 including assist lines 1420, bias lines 1430, and negative serifs 1450.

FIG. 17 illustrates an example screen snapshot of a +1 OPC correction layer from a computer system executing one embodiment of the invention to provide OPC correction. This layer contains corrections to cell 1310 including hammerheads 1410, assist lines 1420, and positive serifs 1440.

FIG. 18 illustrates an example screen snapshot of a −2 OPC correction layer from a computer system executing one embodiment of the invention to provide OPC correction. This layer contains corrections to cell 1310 including end butting correction feature 1810.

FIG. 19 illustrates an example screen snapshot of an individual cell 1310 that has been OPC corrected by a computer system executing one embodiment of the invention. The design window 1330 illustrates a cell 1310 to which its linked correction layer has been applied. The corrections applied to the cell 1310 include hammerheads 1410, assist lines 1420, positive serifs 1440, and negative serifs 1450. Note that the corrections to cell 1310 are different than those illustrated in FIG. 14 because FIG. 14 is a representation of all the corrections to the entire design—while FIG. 19 only illustrates those corrections necessary to correct cell 1310 individually. In other words, the corrections illustrated in FIG. 19 do not take into account the interactions of cell 1310 with other cells adjacent to it. For instance, note that the bias lines 1430 of FIG. 14 are not present in FIG. 19.

Although illustrative embodiments of the invention have been described in detail herein with reference to the accompanying drawings, it is to be understood that the invention is not limited to those precise embodiments. They are not intended to be exhaustive or to limit the invention to the precise forms disclosed. As such, many modifications and variations will be apparent to practitioners skilled in this art. Accordingly, it is intended that the scope of the invention be defined by the following claims and their equivalents.

What is claimed is:

1. In a system for performing an operation in accordance with a particular set of operating criteria on a hierarchically described integrated circuit layout comprising a plurality of cells, the hierarchically described integrated circuit layout having a flattened layout which comprises a rendering of geometric features of the plurality of cells in the hierarchically described integrated circuit layout, a computer program product comprising computer readable media, the computer program product including first program data comprising hierarchically configured correction data corresponding to the hierarchically described layout, the hierarchically configured correction data comprising a plurality of delta planes corresponding to the plurality of cells, and wherein if the first program data were applied to the flattened layout an output comprising data representative of a result of performing the operation on the hierarchically described layout would be generated.

2. The computer program product of claim 1, wherein the delta plane of a particular cell having child cells comprises data representative of a difference between a correction plane of the particular cell and the delta planes corresponding to the child cells of the particular cell.

3. The computer program product of claim 2, wherein the correction plane for each cell of the plurality of cells having child cells, comprises data that would generate an output data representative of the result of performing the operation on the cell if the correction plane were applied to flattened cell data for the cell and its child cells.

4. The computer program product of claim 3 wherein the delta plane for each cell having child cells in the hierarchically described integrated circuit layout accounts for interaction between each of the cell's child cells and interaction between a primitive geometry represented by the cell and each of the cell's child cells.

5. The computer program product of claim 1 wherein the first program data comprises a set of arithmetically described delta planes.

6. The computer program product of claim 1 wherein the first program data comprises a set of logically described delta planes.

7. The computer program product of claim 1, wherein the operation comprises one of a group of operations including logical and arithmetic operations.

8. The computer program product of claim 1, wherein the first program data comprises data described by a GDS-II data file.

9. The computer program product of claim 1 wherein the first program data comprises data which corrects the hierarchically described layout for optical proximity effects.

10. The computer program product of claim 1 wherein the first program data comprises data which corrects the hierarchically described layout for a logical operation performed on the hierarchically described layout.

11. The computer program product of claim 10 wherein the logical operation comprises one of a group of logical operations including AND, NOT, OR, NOR and NAND.

12. The computer program product of claim 1 wherein the hierarchically described layout comprises one of a bright field and a dark field layout.

13. The computer program product of claim 1 wherein the hierarchically described layout comprises a phase shifting layout.

14. The method of performing an operation on a hierarchically described integrated circuit layout, the method comprising:
providing the hierarchically described integrated circuit layout as a first input wherein the hierarchically described layout comprises a plurality of cells, the hierarchically described integrated circuit layout having a flattened layout which comprises a rendering of geometric features of the plurality of cells in the hierarchically described integrated circuit layout;
providing a particular set of operating criteria as a second input;
performing a layout operation in accordance with the particular set of operating criteria on the hierarchically described layout; and
generating a first program data comprising hierarchically configured correction data corresponding to the hierarchically described layout, the hierarchically configured correction data comprising a plurality of delta planes corresponding to the plurality of cells, in response to the layout operation such that if the first program data were applied to the flattened layout an output comprising data representative of the result of performing the operation on the hierarchically described layout would be generated.

15. The method of performing an operation on a hierarchically described integrated circuit layout of claim 14, wherein the delta plane of a particular cell having child cells comprises data representative of a difference between a correction plane of the particular cell and the delta planes corresponding to the child cells of the particular cell.

16. The method of performing an operation on a hierarchically described integrated circuit layout of claim 15, wherein the correction plane for each cell in the plurality of cells having child cells, comprises data that would generate an output data representative of the result of performing the operation on the cell if the correction plane were applied to flattened cell data for the cell and its child cells.

17. The method of performing an operation on a hierarchically described integrated circuit layout of claim 16 wherein the delta plane for each cell having child cells in the hierarchically described integrated circuit layout accounts for interaction between each of the cell's child cells and interaction between a primitive geometry represented by the cell and each of the cell's child cells.

18. The method of performing an operation on a hierarchically described integrated circuit layout of claim 15 wherein the first program data comprises a set of arithmetically described delta planes.

19. The method of performing an operation on a hierarchically described integrated circuit layout of claim 15 wherein the first program data comprises a set of logically described delta planes.

20. The method of performing an operation on a hierarchically described integrated circuit layout of claim 14 wherein the first program data comprises a plurality of delta planes corresponding to the plurality of cells, and wherein generating the first program data comprises:
compiling the hierarchically described layout, wherein compiling comprises generating a first correction layer for each cell of the plurality of cells in response to the particular set of operating criteria; and
linking the hierarchically described layout, wherein linking comprises modifying the correction layer of each cell in response to the particular set of operating criteria to generate the delta plane for each cell such that the delta plane of each cell accounts for interaction between each of the cell's child cells and interaction between the cell's primitive geometry and each of the cell's child cells.

21. The method of performing an operation on a hierarchically described integrated circuit layout of claim 20 wherein for each cell in the hierarchically described layout the sum of the cell's delta plane and the delta planes of the cell's child cells comprises a correction plane of the cell wherein the correction plane for each cell in the plurality of cells comprises data that would generate an output data representative of the result of performing the operation on the cell if the correction plane were applied to the flattened cell data.

22. The method of performing an operation on a hierarchically described integrated circuit layout of claim 20 wherein compiling comprises a depth-wise traversing of the hierarchically described layout.

23. The method of performing an operation on a hierarchically described integrated circuit layout of claim 20 wherein linking comprises a depth-wise traversing of the hierarchically described layout.

24. The method of performing an operation on a hierarchically described integrated circuit layout of claim 14 further comprising:
  combining the first program data with the data describing the integrated circuit layout to produce a second program data that describes a first corrected layout;
  providing the second program data to a design rule checker apparatus; and
  operating the design rule checker apparatus to determine whether the first corrected layout falls within a set of integrated circuit design rules.

25. The method of performing an operation on a hierarchically described integrated circuit layout of claim 14 wherein the first program data is provided on a computer readable media.

26. The method of performing an operation on a hierarchically described integrated circuit layout of claim 14 wherein the operation comprises one of a group of operations including logical and arithmetic operations.

27. The method of performing an operation on a hierarchically described integrated circuit layout of claim 14 wherein the first program data comprises data described by a GDS-II data file.

28. The method of performing an operation on a hierarchically described integrated circuit layout of claim 14 wherein the first program data comprises data which corrects the hierarchically described layout for optical proximity effects.

29. The method of performing an operation on a hierarchically described integrated circuit layout of claim 14 wherein the first program data comprises data which corrects the hierarchically described layout for a logical operation performed on the hierarchically described layout.

30. The method of performing an operation on a hierarchically described integrated circuit layout of claim 29 wherein the logical operation comprises one of a group of logical operations including AND, NOT, OR, NOR and NAND.

31. The method of performing an operation on a hierarchically described integrated circuit layout of claim 14 wherein the hierarchically described layout comprises one of a bright field and a dark field layout.

32. The method of performing an operation on a hierarchically described integrated circuit layout of claim 14 wherein the hierarchically described layout comprises a phase shifting layout.

33. A program storage device readable by a machine, tangibly embodying a program of instructions executable by said machine to perform method steps to perform an operation on a hierarchically described integrated circuit layout, the method comprising:
  providing the hierarchically described integrated circuit layout as a first input wherein the hierarchically described layout comprises a plurality of cells, the hierarchically described integrated circuit layout having a flattened layout which comprises a rendering of geometric features of the plurality of cells in the hierarchically described integrated circuit layout;
  providing a particular set of operating criteria as a second input;
  performing a layout operation in accordance with the particular set of operating criteria on the hierarchically described layout; and
  generating a first program data comprising hierarchically configured correction data corresponding to the hierarchically described layout, the hierarchically configured correction data comprising a plurality of delta planes corresponding to the plurality of cells, in response to the layout operation such that if the first program data were applied to the flattened layout an output comprising data representative of the result of performing the operation on the hierarchically described layout would be generated.

34. The program storage device readable by a machine of claim 33, wherein the delta plane of a particular cell having child cells comprises data representative of a difference between a correction plane of the particular cell and the delta planes corresponding to the child cells of the particular cell.

35. The program storage device readable by a machine of claim 34, wherein the correction plane for each cell in the plurality of cells having child cells comprises data that would generate an output data representative of the result of performing the operation on the cell if the correction plane were applied to flattened cell data for the cell and its child cells.

36. The program storage device readable by a machine of claim 35 wherein the delta plane for each cell having child cells in the hierarchically described integrated circuit layout accounts for interaction between each of the cell's child cells and interaction between a primitive geometry represented by the cell and each of the cell's child cells.

37. The program storage device readable by a machine of claim 34 wherein the first program data comprises a set of arithmetically described delta planes.

38. The program storage device readable by a machine of claim 34 wherein the first program data comprises a set of logically described delta planes.

39. The program storage device readable by a machine of claim 33 wherein generating the first program data comprises:
  compiling the hierarchically described layout, wherein compiling comprises generating a first correction layer for each cell of the plurality of cells in response to the particular set of operating criteria; and
  linking the hierarchically described layout, wherein linking comprises modifying the correction layer of each cell in response to the particular set of operating criteria to generate the delta plane for each cell having child cells such that the delta plane of each cell accounts for interaction between each of the cell's child cells and interaction between a primitive geometry of the cell and each of the cell's child cells.

40. The program storage device readable by a machine of claim 39 wherein for each cell in the hierarchically described layout the sum of the cell's delta plane and the delta planes of the cell's child cells comprises a correction plane of the cell wherein the correction plane for each cell in the plurality of cells comprises data that would generate an output data representative of the result of performing the operation on the cell if the correction plane were applied to the flattened cell data.

41. The program storage device readable by a machine of claim 39 wherein compiling comprises a depth-wise traversing of the hierarchically described layout.

42. The program storage device readable by a machine of claim 39 wherein linking comprises a depth-wise traversing of the hierarchically described layout.

43. The program storage device readable by a machine of claim 33 wherein the first program data is provided on a computer readable media.

44. The program storage device readable by a machine of claim 33 wherein the operation comprises one of a group of operations including logical and arithmetic operations.

45. The program storage device readable by a machine of claim 33 wherein the first program data comprises data described by a GDS-II data file.

46. The program storage device readable by a machine of claim 33 wherein the first program data comprises data which corrects the hierarchically described layout for optical proximity effects.

47. The program storage device readable by a machine of claim 33 wherein the first program data comprises data which corrects the hierarchically described layout for a logical operation performed on the hierarchically described layout.

48. The program storage device readable by a machine of claim 47 wherein the logical operation comprises one of a group of logical operations including AND, NOT, OR, NOR and NAND.

49. The program storage device readable by a machine of claim 33 wherein the hierarchically described layout comprises one of a bright field and a dark field layout.

50. The program storage device readable by a machine of claim 33 wherein the hierarchically described layout comprises a phase shifting layout.

51. The program storage device readable by a machine of claim 33 wherein the program storage device comprises a hard disk drive.

52. The program storage device readable by a machine of claim 33 wherein the program storage device comprises storage in a server.

53. An apparatus for performing an operation on a hierarchically described integrated circuit layout, the apparatus comprising:
   a resource for receiving the hierarchically described integrated circuit layout as a first input, wherein the hierarchically described layout comprises a plurality of cells, the hierarchically described layout having a flattened layout which comprises a rendering of geometric features of the plurality of cells in the hierarchically described layout;
   a resource for receiving a particular set of operating criteria as a second input;
   an operation engine which performs a layout operation in accordance with the particular set of operating criteria on the hierarchically described layout; and
   a hierarchy preserver which generates a first program data comprising hierarchically configured correction data corresponding to the hierarchically described layout, the hierarchically configured correction data comprising a plurality of delta planes corresponding to the plurality of cells, in response to the layout operation such that if the first program data were applied to the flattened layout an output comprising data representative of the result of performing the operation on the hierarchically described layout would be generated.

54. The apparatus for performing an operation on a hierarchically described integrated circuit layout of claim 53 wherein the delta plane of a particular cell having child cells comprises data representative of a difference between a correction plane of the particular cell and the delta planes corresponding to the children cells of the particular cell.

55. The apparatus for performing an operation on a hierarchically described integrated circuit layout of claim 54, wherein the correction plane for each cell having child cells in the plurality of cells comprises data that would generate an output data representative of the result of performing the operation on the cell if the correction plane were applied to flattened cell data for the particular cell and its child cells.

56. The apparatus for performing an operation on a hierarchically described integrated circuit layout of claim 55 wherein the delta plane for each cell having child cells in the hierarchically described integrated circuit layout accounts for interaction between each of the cell's child cells and interaction between a primitive geometry of the cell and each of the cell's child cells.

57. The apparatus for performing an operation on a hierarchically described integrated circuit layout of claim 54 wherein the first program data comprises a set of arithmetically described delta planes.

58. The apparatus for performing an operation on a hierarchically described integrated circuit layout of claim 54 wherein the first program data comprises a set of logically described delta planes.

59. The apparatus for performing an operation on a hierarchically described integrated circuit layout of claim 53 wherein the first program data comprises a plurality of delta planes corresponding to the plurality of cells, and wherein the hierarchy preserver comprises:
   a compiler which generates a first correction layer for each cell in response to the particular set of operating criteria; and
   a linker which modifies the first correction layer of each cell in response to the particular set of operating criteria to generate the delta plane for each cell such that the delta plane of each cell having child cells accounts for interaction between each of the cell's child cells and interaction between a primitive geometry of the cell and each of the cell's child cells.

60. The apparatus for performing an operation on a hierarchically described integrated circuit layout of claim 59 wherein for each cell having child cells in the hierarchically described layout the sum of the cell's delta plane and delta planes of the cell's child cells comprises a correction plane of the cell wherein the correction plane for each cell in the plurality of cells comprises data that would generate an output data representative of the result of performing the operation on the cell if the correction plane were applied to flattened cell data for the cell and its child cells.

61. The apparatus for performing an operation on a hierarchically described integrated circuit layout of claim 59 wherein the generation of the first correction layers comprises a depth-wise traversing of the hierarchically described layout.

62. The apparatus for performing an operation on a hierarchically described integrated circuit layout of claim 59 wherein the generation of the delta planes comprises a depth-wise traversing of the hierarchically described layout.

63. The apparatus for performing an operation on a hierarchically described integrated circuit layout of claim 53 further comprising:
   a resource for combining the first program data with the data describing the integrated circuit layout to produce a second program data that describes a first corrected layout; and
   a design rule checker apparatus which receives the second program data and which provides an output that indicates whether the first corrected layout falls within a set of integrated circuit design rules.

64. The apparatus for performing an operation on a hierarchically described integrated circuit layout of claim 53 wherein the first program data is provided on a computer readable media.

65. The apparatus for performing an operation on a hierarchically described integrated circuit layout of claim 53 wherein the operation comprises one of a group of operations including logical and arithmetic operations.

66. The apparatus for performing an operation on a hierarchically described integrated circuit layout of claim 53 wherein the first program data comprises data described by a GDS-II data file.

67. The apparatus for performing an operation on a hierarchically described integrated circuit layout of claim 53 wherein the first program data comprises data which corrects the hierarchically described layout data for optical proximity effects.

68. The apparatus for performing an operation on a hierarchically described integrated circuit layout of claim 53 wherein the first program data comprises data which corrects the hierarchically described layout for a logical operation performed on the hierarchically described layout data.

69. The apparatus for performing an operation on a hierarchically described integrated circuit layout of claim 68 wherein the logical operation comprises one of a group of logical operations including AND, NOT, OR, NOR and NAND.

70. The apparatus for performing an operation on a hierarchically described integrated circuit layout of claim 53 wherein the hierarchically described layout comprises one of a bright field and a dark field layout.

71. The apparatus for performing an operation on a hierarchically described integrated circuit layout of claim 53 wherein the hierarchically described layout comprises a phase shifting layout.

72. The apparatus for performing an operation on a hierarchically described integrated circuit layout of claim 53 wherein the apparatus comprises a computer program product which comprises a computer usable medium having a computer readable program code embodied therein for causing a computer to perform the operation on the hierarchically described integrated circuit layout.

73. A photolithography mask which has been produced according to a method for performing an operation on a hierarchically described integrated circuit layout, the method comprising:
    providing the hierarchically described integrated circuit layout as a first input wherein the hierarchically described layout comprises a plurality of cells, the hierarchically described layout having a flattened layout which comprises a rendering of geometric features of the plurality of cells in the hierarchically described layout;
    providing a particular set of operating criteria as a second input;
    performing a layout operation in accordance with the particular set of operating criteria on the hierarchically described layout; and
    generating a first program data comprising hierarchically configured correction data corresponding to the hierarchically described layout, the hierarchically configured correction data comprising a plurality of delta planes corresponding to the plurality of cells, in response to the layout operation such that if the first program data were applied to the flattened layout an output comprising data representative of a result of performing the operation on the hierarchically described layout would be generated;
    providing the first program data and data describing the hierarchically described layout to a mask making apparatus; and
    generating the photolithography mask with the mask making apparatus in response to the data describing the hierarchically described layout and the first program data.

74. The photolithography mask of claim 73, wherein the delta plane of a particular cell having child cells comprises data representative of a difference between a correction plane of the particular cell and the delta planes corresponding to the child cells of the particular cell.

75. The photolithography mask of claim 74, wherein the correction plane for each cell having child cells in the plurality of cells comprises data that would generate an output data representative of a result of performing the operation on the cell if the correction plane were applied to flattened cell data for the cell and its child cells.

76. The photolithography mask of claim 75 wherein the delta plane for each cell having child cells in the hierarchically described integrated circuit layout accounts for interaction between each of the cell's child cells and interaction between a primitive geometry of the cell and each of the cell's child cells.

77. The photolithography mask of claim 74 wherein the first program data comprises a set of arithmetically described delta planes.

78. The photolithography mask of claim 74 wherein the first program data comprises a set of logically described delta planes.

79. The photolithography mask of claim 73 wherein generating the first program data comprises:
    compiling the hierarchically described layout, wherein compiling comprises generating a first correction layer for each cell of the plurality of cells in response to the particular set of operating criteria; and
    linking the hierarchically described layout, wherein linking comprises modifying the correction layer of each cell in response to the particular set of operating criteria to generate the delta plane for each cell such that the delta plane of each cell having child cells accounts for interaction between each of the cell's child cells and interaction between a primitive geometry of the cell and each of the cell's child cells.

80. The photolithography mask of claim 79 wherein for each cell having child cells in the hierarchically described layout the sum of the cell's delta plane and the delta planes of the cell's child cells comprises a correction plane of the cell wherein the correction plane for each cell in the plurality of cells comprises data that would generate an output data representative of the result of performing the operation on the cell if the correction plane were applied to flattened cell data for the cell and its child cells.

81. The photolithography mask of claim 79 wherein compiling comprises a depth-wise traversing of the hierarchically described layout.

82. The photolithography mask of claim 79 wherein linking comprises a depth-wise traversing of the hierarchically described layout.

83. The photolithography mask of claim 73 wherein the method further comprises:
    combining the first program data with the data describing the integrated circuit layout to produce a second program data that describes a first corrected layout;
    providing the second program data to a design rule checker apparatus; and
    operating the design rule checker apparatus to determine whether the first corrected layout falls within a set of integrated circuit design rules.

84. The photolithography mask of claim 73 wherein the first program data is provided on a computer readable media.

85. The photolithography mask of claim 73 wherein the operation comprises one of a group of operations including logical and arithmetic operations.

86. The photolithography mask of claim 73 wherein the first program data comprises data described by a GDS-II data file.

87. The photolithography mask of claim 73 wherein the first program data comprises data which corrects the hierarchically described layout for optical proximity effects.

88. The photolithography mask of claim 73 wherein the first program data comprises data which corrects the hierarchically described layout for a logical operation performed on the hierarchically described layout.

89. The photolithography mask of claim 88 wherein the logical operation comprises one of a group of logical operations including AND, NOT, OR, NOR and NAND.

90. The photolithography mask of claim 73 wherein the hierarchically described layout comprises one of a bright field and a dark field layout.

91. The photolithography mask of claim 73 wherein the hierarchically described layout comprises a phase shifting layout.

92. The photolithography mask of claim 73 wherein the method steps for performing the operation on the hierarchically described integrated circuit layout are executed by a machine in response to a program of instructions embodied in a program storage device readable by the machine.

* * * * *